US011242263B2

(12) United States Patent
Gao et al.

(10) Patent No.: US 11,242,263 B2
(45) Date of Patent: Feb. 8, 2022

(54) METHODS OF MAKING BANDGAP-TUNABLE PEROVSKITE MATERIALS

(71) Applicant: The Florida State University Research Foundation, Inc., Tallahassee, FL (US)

(72) Inventors: Hanwei Gao, Tallahassee, FL (US); Biwu Ma, Tallahassee, FL (US); Yichuan Ling, Tallahassee, FL (US); Xi Wang, Tallahassee, FL (US)

(73) Assignee: THE FLORIDA STATE UNIVERSITY RESEARCH FOUNDATION, INC, Tallahassee, FL (US)

( * ) Notice: Subject to any disclaimer, the term of this patent is extended or adjusted under 35 U.S.C. 154(b) by 50 days.

(21) Appl. No.: 16/862,833

(22) Filed: Apr. 30, 2020

(65) Prior Publication Data
US 2020/0270141 A1    Aug. 27, 2020

Related U.S. Application Data

(62) Division of application No. 16/117,628, filed on Aug. 30, 2018.
(Continued)

(51) Int. Cl.
C01G 21/00    (2006.01)
H01L 33/26    (2010.01)
(Continued)

(52) U.S. Cl.
CPC .............. *C01G 21/006* (2013.01); *C07F 7/24* (2013.01); *H01L 31/0328* (2013.01);
(Continued)

(58) Field of Classification Search
CPC ........ C01G 21/006; C01D 17/00; C01D 3/04; C01P 2002/34
See application file for complete search history.

(56) References Cited

U.S. PATENT DOCUMENTS

2017/0047530 A1    2/2017    Ma et al.
2017/0084848 A1    3/2017    Gao et al.
(Continued)

FOREIGN PATENT DOCUMENTS

EP    3296378 A1    3/2018

OTHER PUBLICATIONS

International Search Report and the Written Opinion of PCT/US2018/048737 dated Nov. 20, 2018.
(Continued)

*Primary Examiner* — Ngoc-Yen Nguyen
(74) *Attorney, Agent, or Firm* — Eversheds Sutherland (US) LLP

(57) ABSTRACT

Bandgap-tunable perovskite compositions are provided having the formula $CsPb(A_xB_y)_3$, wherein A and B are each a halogen. The mixed halide perovskite composition has a morphology which suppresses phase segregation to stabilize a tuned bandgap of the mixed halide perovskite composition. For example, the perovskite may be in the form of nanocrystals embedded in a non-perovskite matrix, which, for example, may have the formula $Cs_4Pb(A_xB_y)_6$, wherein A and B are each a halogen. Solar cells and light-emitting diodes comprising the mixed perovskite compositions are also provided.

16 Claims, 16 Drawing Sheets

Related U.S. Application Data

(60) Provisional application No. 62/552,009, filed on Aug. 30, 2017.

(51) Int. Cl.
| | | |
|---|---|---|
| *H01L 31/0328* | (2006.01) | |
| *C07F 7/24* | (2006.01) | |
| *H01L 51/50* | (2006.01) | |
| *H01L 51/42* | (2006.01) | |
| *H01L 51/00* | (2006.01) | |

(52) U.S. Cl.
CPC ............ *H01L 33/26* (2013.01); *H01L 51/005* (2013.01); *H01L 51/4246* (2013.01); *H01L 51/4273* (2013.01); *H01L 51/502* (2013.01); *C01P 2002/34* (2013.01); *C01P 2002/60* (2013.01); *C01P 2002/84* (2013.01); *C01P 2002/90* (2013.01); *H01L 2251/301* (2013.01)

(56) References Cited

U.S. PATENT DOCUMENTS

| | | |
|---|---|---|
| 2017/0324057 A1 | 11/2017 | Friend et al. |
| 2018/0040769 A1 | 2/2018 | Gao et al. |
| 2018/0159041 A1 | 6/2018 | Ma et al. |
| 2018/0196164 A1* | 7/2018 | Friend .................. H01L 51/005 |
| 2018/0204978 A1 | 7/2018 | Gao et al. |
| 2018/0212175 A1 | 7/2018 | Mariotti |
| 2018/0298278 A1 | 10/2018 | Zhong et al. |

OTHER PUBLICATIONS

Zhang, H., et al., "Embedding Perovskite Nanocrystals into a Polymer Matrix for Tunable Luminescene Probes in Cell Imaging", Advanced Functional Materials, vol. 27, No. 7, (Feb. 1, 2017), p. 1604382 (8 pages).

* cited by examiner

METHODS OF MAKING BANDGAP-TUNABLE PEROVSKITE MATERIALS

CROSS-REFERENCE TO RELATED APPLICATIONS

This application is a divisional of U.S. application Ser. No. 16/117,628, filed Aug. 30, 2018, which claims priority to U.S. Provisional Application No. 62/552,009, filed Aug. 30, 2017, which are incorporated herein by reference.

FIELD OF THE DISCLOSURE

The present disclosure relates to generally to perovskite materials and methods of making the same, and more specifically to bandgap-tunable perovskite materials.

BACKGROUND

Solution-based processes are commonly used to synthesize mixed halide perovskites. Perovskites having an emission in the region between 400 nm and 750 nm, which may be useful in applications such as solar cells or light-emitting diodes, can be obtained by a mixed solution of bromide and iodide (e.g., $CsPbBr_3$ and $CsPbI_3$) or chloride and bromide.

However, mixtures of perovskite compositions often experience phase separation, whereby the $CsPbBr_3$ and $CsPbI_3$ perovskites separate from each other into two distinct phases, such that the perovskite thin film no longer has the desired properties of the mixture of solid state $CsPbBr_3$ and $CsPbI_3$.

Accordingly, improved perovskite compositions and methods of making the same are needed, including methods that eliminate or reduce phase segregation.

SUMMARY

In one aspect, mixed halide perovskite compositions are provided, having the formula $CsPb(A_xB_y)_3$, wherein A and B are each a halogen, wherein the composition has a morphology which suppresses phase segregation to stabilize a tuned bandgap of the mixed halide perovskite composition. The mixed halide perovskite compositions may be in the form of nanocrystals confined in a non-perovskite matrix, in particular a matrix having the formula $Cs_4Pb(A_xB_y)_6$, wherein A and B are each a halogen.

In some embodiments, the mixed halide perovskite composition includes photo-active crystallites of perovskite having the formula $CsPb(I_yBr_x)_3$, and a host matrix of a photo-inactive insulating crystallites in which the photo-active crystallites are embedded, wherein the host matrix is effective to suppress ion-migration leading to the formation of iodine-rich and bromine-rich regions in the composition. In some embodiments, the composition is the form of a film formed by a physical deposition process, for example, the film being applied onto a glass or other suitable substrate. In some embodiments, the photo-inactive insulating crystallites comprise crystallites of $Cs_4Pb(I_yBr_y)_6$.

In another aspect, solar cells. LEDs. or other devices comprising the mixed halide perovskite compositions are provided. In some embodiments, a solar cell includes a hole transport layer; an electron transport layer; a metal electrode adjacent to the hole transport layer; a transparent electrode adjacent to the electron transport layer; and a perovskite layer. e.g., in the form of a film, comprising the mixed halide perovskite composition disposed between the hole transport layer and the electron transport layer. In some other embodiments, a light-emitting diode includes an electron injection layer; a hole injection layer; a metal electrode adjacent to the electron injection layer; a transparent electrode adjacent to the hole injection layer; and a perovskite layer, e.g., in the form of a film, comprising the mixed halide perovskite composition disposed between the electron injection layer and the hole injection layer.

In yet another aspect, methods are provided for making perovskite films. In some embodiments, the method includes depositing a first portion of a first precursor solution on a substrate; and depositing a first portion of a second precursor solution on the substrate, wherein the second precursor solution is different from the first precursor solution, wherein the depositing of the first and second precursor solutions is carried out in a manner effective to produce a mixed halide composition comprising a perovskite having the formula: $CsPb(A_xB_y)_3$ wherein A and B are each a halogen, and the perovskite is in the form of nanocrystals embedded in a non-perovskite matrix, which suppresses phase segregation to stabilize a tuned bandgap of the mixed halide perovskite composition.

BRIEF DESCRIPTION OF THE DRAWINGS

The detailed description is set forth with reference to the accompanying drawings. The use of the same reference numerals may indicate similar or identical items. Various embodiments may utilize elements and/or components other than those illustrated in the drawings, and some elements and/or components may not be present in various embodiments. Elements and/or components in the figures are not necessarily drawn to scale.

DETAILED DESCRIPTION

Figure 1:
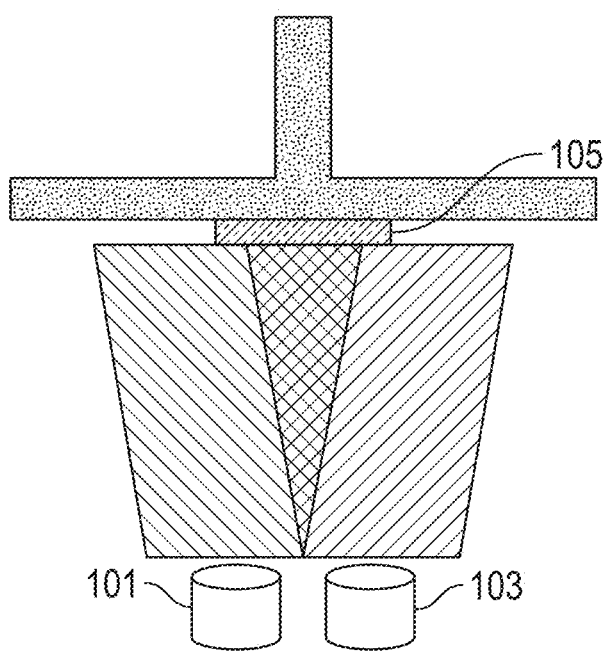
FIG. 1 illustrates a dual-source vapor evaporation process according to an embodiment of the present disclosure.

Since every metal-halide perovskite combination produces green, red, or blue light, one would expect that color tunability across the entire visible spectrum is practically impossible. However, surprisingly, fine tuning the band gaps can be achieved by replacing the pure X-halide ions with a composition of mixed halide ($I_xBr_y$, $Br_xCl_y$, $Cl_xI_y$), as described herein. Varying composition of mixed halide perovskite can emit an array of colors expanding across the visible light spectrum and into the near infrared region. This is related to the fact that the electronic bandgaps are strongly dependent on the unit cell sizes of the crystal lattices. Due to the different sizes of chlorine, bromine, and iodine ions, bandgap tuning can be achieved by mixing halogen ions with different molar concentrations in the halide perovskites.

Wavelength tunability or bandgap tuning of mixed halide perovskite, $CsPb(I_xBr_y)_3$ (y=1−x), can be achieved by changing the composition of iodide and bromide ions, but for some mixed halide perovskite compositions under continuous illumination the photoluminescence (PL) peak position shifts from its initial position. This optical instability is attributed to phase segregation, where until photoexcitation the mixed halide anions migrate to iodide-rich and bromide-rich domains. Recent work has shown PL peak stability for mixed halide composition x>0.6, however this limits the range of tunability to wavelengths greater than 640 nanometers (nm). Provided herein are dual-source vapor-evaporation methods to create mixed halide which can suppress the phase segregation and improve the photoluminescence stability.

As used herein, "perovskite" refers to the broad family of materials including a unit cell having the formula $ABX_3$, where in general A and B are cations and X are anions. For example, perovskite includes materials including $CsPbI_3$, and $CsPbBr_3$.

Cesium-based perovskite is more thermally and chemically stable in ambient conditions than formamidinium-based and methylammonium-based perovskite, but cesium-based perovskite is not invulnerable to environmental effects. Due to hygroscopic nature of alkali halide, $APbX_3$ perovskites are very violate and decompose to $PbX_2$ if left in humid environments. For example, $CsPbI_3$ thin films exposed to air for only a few minutes have been found to change from transparent and reflective surface to rough and diffusive appearance. To avoid degradation of this material, in some embodiments, perovskites may be stored in low-oxygen or low-humidity environments, or may be encapsulated immediately after being formed according to methods known in the art. For example, in some embodiments, perovskite compositions may be encapsulated with polymethylmethacrylate (PMMA) coatings. In some embodiments, nanocrystals of the perovskites described herein may be dispersed and isolated in a non-ionic-conductive matrix. While not intending to be bound by any particular theory, it is believed that this will prevent the halogen ions from migrating across the grain boundaries and segregating into different phases under optical or electrical stimuli.

In some embodiments of the present disclosure, perovskite compositions which contain bromine, chlorine, or iodine are provided. In some embodiments, these perovskite compositions are of the formula $CsPb(I_xBr_y)_3$, and in some embodiments, y=1−x. In some embodiments, the perovskite compositions provided herein are $CsPbBr_3$, $CsPbI_3$, $CsPbIBr_2$, or $CsPbI_2Br$. In some embodiments, the ratio of iodine to bromine is about 3:0, about 2:1, about 1:1, about 1:2, or about 0:3.

In some embodiments, the perovskite composition comprises a $Cs(I_x)_3$ layer and a $Pb(Br_y)_3$ layer, a $Cs(Br_y)_3$ layer and a $Pb(I_x)_3$ layer, a $CsPb(I_xBr_y)_3$ layer, or combinations thereof. For example, in some embodiments, the perovskite composition may comprise a single a $CsPb(I_xBr_y)_3$ layer. In some embodiments, the perovskite composition includes multiple $Cs(I_x)_3$ layers and a $Pb(Br_y)_3$ layer, multiple $Cs(Br_y)_3$ layers and $Pb(I_x)_3$ layers, or combinations thereof.

In some embodiments, the perovskite composition includes a non-perovskite matrix of the formula $Cs_4Pb(I_xBr_y)_6$, and in some embodiments, y=x−1. In some embodiments, the perovskite compositions provided herein include $Cs_4PbBr_6$, $Cs_4PbI_6$, $Cs_4PbI_5Br$, $Cs_4PbI_4Br_2$, $Cs_4PbI_3Br_3$, $Cs_4PbI_2Br_4$, and $Cs_4PbIBr_5$.

In some embodiments, the perovskite composition includes one or more perovskites in the form of nanocrystals embedded in a non-perovskite matrix. For example, in some embodiments the perovskite compositions include photoluminescent crystallites of perovskite having the formula $CsPb(I_xBr_y)_3$, and a host matrix of a photo-inactive insulating crystallites in which the photoluminescent crystallites are embedded. In embodiments, the host matrix is effective to suppress ion-migration leading to the formation of iodine-rich and bromine-rich regions in the composition.

In some embodiments, the perovskite compositions may have a normalized photoluminescence of from about 500 nm to about 650 nm. In some embodiments, the perovskite compositions may have a normalized photoluminescence which differs from that of $CsPbI_3$ and differs from that of $CsPbBr_3$. In some embodiments, the perovskite compositions may have one or more UV-vis absorption peaks between from about 225 nm and about 600 nm. In some embodiments, the perovskite composition described herein may have UV-vis absorption peaks which differ from those of $CsPbI_3$ and differs from those of $CsPbBr_3$.

The mixed halide perovskite compositions described herein are useful in a wide variety of devices, products, and methods of use. In some embodiments, for example, the mixed halide perovskite composition may serve as a light-emitting or photo-active material used in solar cells and LEDs.

Figure 14:
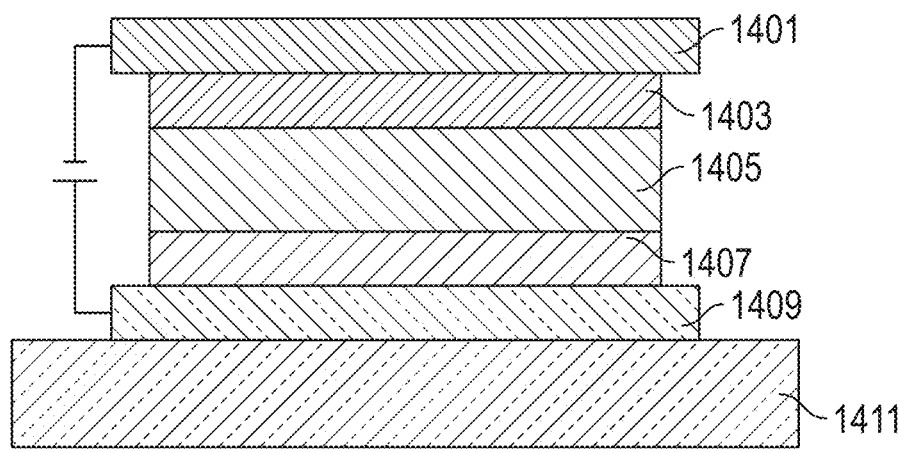
FIG. 14 is a cross-sectional view of one embodiment of an LED comprising a photoluminescent perovskite material according to present disclosure.

One example of an LED comprising a mixed halide perovskite composition is shown in FIG. 14. Perovskite-based light-emitting diode (LED) 1400 includes an electron injection layer 1403; a hole injection layer 1407; a metal electrode 1401 adjacent to the electron injection layer 1403; a transparent electrode 1409 adjacent to the hole injection layer 1407; and a perovskite layer 1405 comprising the mixed halide perovskite composition disposed between the electron injection layer 1403 and the hole injection layer 1407. The layers between the electrodes typically are in the form of thin films, which may be formed by a physical vapor deposition process. The electrodes also may be in the form of thin films. The metal electrode 1401 may be made of aluminum or another suitable metal. The electron injection layer 1403 may be made of lithium fluoride-doped 2,2',2"-(1,3,5-benzenetriyl)-tris(1-phenyl-1-H-benzimidazole) (TPBi/LiF), for example. The perovskite layer 1405 is a mixed halide perovskite film according to the present disclosure. The hole injection layer 1407 may be made of poly(3,4-ethylenedioxythiophene) polystyrene sulfonate (PEDOT:PSS), for example. The transparent electrode 1409 may be made of indium-tin-oxide (ITO), for example. In the illustrated embodiment, the LED 1400 also includes a transparent substrate 1411. The transparent substrate 1411 may be made of a glass. Other materials of construction known in the art may be used to form the electrodes, the electron injection layer, the hole injection layer, and/or the substrate.

Figure 15:
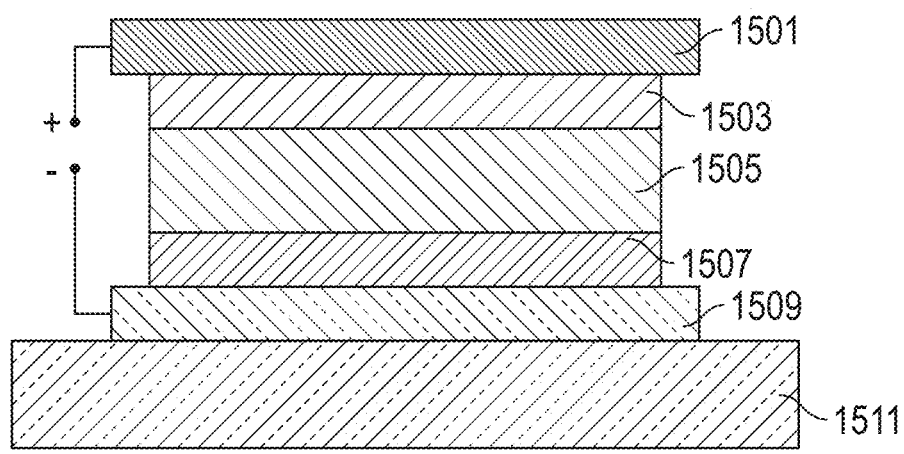
FIG. 15 is a cross-sectional view of one embodiment of a solar cell comprising a photo-active perovskite material according to the present disclosure.

One example of a solar cell comprising a mixed halide perovskite composition is shown in FIG. 15. Perovskite-based solar cell 1500 includes a hole transport layer 1503; an electron transport layer 1507; a metal electrode 1501 adjacent to the hole transport layer 1503; a transparent electrode 1509 adjacent to the electron transport layer 1507; and a perovskite layer 1505 comprising the mixed halide perovskite composition disposed between the hole transport layer 1503 and the electron transport layer 1507. The layers between the electrodes typically are in the form of thin films, which may be formed by a physical vapor deposition process. The electrodes also may be in the form of thin films. The metal electrode 1501 may be made of gold or another suitable metal. The hole transport layer 1503 may be made of 2,2',7,7'-Tetrakis-(N,N-di-4-methoxyphenylamino)-9,9'-spirobifluorene (Spiro-MeOTAD), for example. The perovskite layer 1505 is a mixed halide perovskite film according to the present disclosure. The electron transport layer 1507 may be made of titanium dioxide ($TiO_2$), for example. The transparent electrode 1509 may be made of fluorine-doped tin oxide (FTO), for example. In the illustrated embodiment, the solar cell 1500 also includes a transparent substrate 1511. The transparent substrate 1511 may be made of a glass. Other materials of construction known in the art may be used to form the electrodes, the electron transport layer, the hole transport layer, and/or the substrate.

Improved methods of making perovskite films have been developed. In particular, it has been discovered how to both (1) make the bandgap of perovskites tunable, and (2) stabilize the tuned bandgap. Essentially, this is accomplished by varying two parameters during synthesis/evaporation. The first parameter is a ratio between two different halogen precursors being evaporated, where the ratio determines the bandgap (or the emission wavelength) of the perovskite. See, e.g., XBr in FIG. 11A-N. In a particular embodiment, this ratio is the ratio between the iodine- and bromine-contained precursors being evaporated. The second parameter is the ratio between precursor elements that determines the relative amounts of the perovskite and non-perovskite crystals in the thin film. In particular embodiments, this ratio is the ratio between the Cs- and Pb-containing precursors, thereby determining the relative amount between perovskite $CsPb(A_xB_y)_3$ and non-perovskite $Cs_4Pb(A_xB_y)_6$ in the thin film obtained. That is, $CsPb(A_xB_y)_3$ is the embedded perovskite crystals, and $Cs_4Pb(A_xB_y)_6$ is the host matrix.

In some embodiments, a method of making a mixed halide perovskite composition includes (i) depositing a first portion of a first precursor solution on a substrate; and (ii) depositing a first portion of a second precursor solution on the substrate, wherein the second precursor solution is different from the first precursor solution, wherein the depositing of the first and second precursor solutions is carried out in a manner effective to produce a mixed halide composition comprising a perovskite having the formula: $CsPb(A_xB_y)_3$ wherein A and B are each a halogen, and the perovskite is in the form of nanocrystals embedded in a non-perovskite matrix, which suppresses phase segregation to stabilize a tuned bandgap of the mixed halide perovskite composition. In particular embodiments, the depositing of the first and second precursor solutions is performed by a physical vapor deposition process. In some embodiments, the method further includes thermal annealing the first and second precursors following their deposition on the substrate.

In some embodiments, the first and second precursor solutions are evaporated simultaneously to create a single layer perovskite film. In some embodiments, the first and second precursor solutions are evaporated sequentially to create two or more distinct layers of perovskite film on the substrate. In some embodiments, the first precursor solution comprises CsBr, CsI, $PbI_2$, or $PbBr_2$. In some embodiments, the second precursor solution comprises CsBr, CsI, $PbI_2$, or $PbBr_2$. In some embodiments, other suitable halogens may be used, for example chlorine. In some embodiments, the steps of evaporating the first and second precursor solutions may be repeated, to produce multiple layers of perovskite materials.

While not intending to be bound by theory, in some embodiments, the perovskites described herein may eliminate the pathways of ion migration and segregation, while maintaining the capability of bandgap tuning. In some embodiments, the perovskites described herein may exhibit excellent spectral stability. In some embodiments, when exposed to light of an intensity of up to 4400 times that of the sun for up to 5 hours, perovskites described herein may exhibit a spectral shift of less than about 5 nm.

EXAMPLES

The present disclosure is further illustrated by the following examples, which are not to be construed in any way as imposing limitations upon the scope thereof. On the contrary, it is to be clearly understood that resort may be had to various other aspects, embodiments, modifications, and equivalents thereof which, after reading the description herein, may suggest themselves to one of ordinary skill in the art without departing from the spirit of the present invention or the scope of the appended claims. Thus, other aspects of this invention will be apparent to those skilled in the art from consideration of the specification and practice of the invention disclosed herein.

In each of the examples described below, perovskite samples were prepared by vapor deposition. First, glass substrates were cleaned by first sonicating for twenty minutes in 1% alconox detergent, acetone, and isopropyl alcohol. Then, the glass substrates were UV-ozone treated for twenty minutes. Precursor solutions were prepared as follows: a first CsI/Br solution was a mixture of cesium bromide (CsBr) (99%) and CsI (99%), purchased from Sigma-Aldrich, and a second Pb(I/Br)2 solution was a mixture of PbBr2 (98%) and PbI2 (98%), purchased from Sigma Aldrich. Polymethylacrylate (PMMA) was purchased from Sigma-Aldrich.

An Edwards E306A coating system with dual-source capability was then used to synthesis perovskite films on the glass substrates by vapor deposition. The deposition rate was monitored by quartz crystals and verified by atomic force microscopy (AFM) measurements. FIG. 1 is a schematic illustration of the coating system, including two ceramic crucibles 101, 103 containing precursors, and a glass substrate 105. The precursors evaporate from the ceramic crucibles 101, 103 and the evaporated precursors 107, 109 deposit on the glass substrate 105.

After evaporation, the resulting perovskite films were evaluated by XRD diffraction. UV-vis absorption, and photoluminescence measurements to characterize the perovskite films. XRD diffraction pattern was carried out by PANalytical X'PERT Pro Powder X-ray diffractometer with a Cu Kα source. Diffraction patterns were recorded from 10° to 35° 2θ with a step size of 0.02° at 0.8° min$^{-1}$ Oc.

The PL spectra were measured using a HORIBA iHR320 spectrometer, equipped with a HORIBA Synapse CCD. A 100 W mercury arc lamp coupled with a 420-nm long pass filter was used as the excitation light source.

Absorption spectra were recorded on an Agilent Cary 5000 UV-Vis-NIR spectrometer. PL efficiency was calculated as the average of PL emission divided by absorption at 365 nm, which is the excitation wavelength used in PL measurement.

Example 1: Dual-Source Vapor Deposition

A dual-source vapor evaporation process was developed and used to synthesize two perovskite structural phases: $CsPb(I_xBr_y)_3$ and $Cs_4Pb(I_xBr_y)_6$, creating host-guest composite between the two phases.

Specifically, two precursor solutions CsI/Br and Pb(I/Br)$_2$ were placed in two separate ceramic crucibles. The first precursor solution was a mixture of CsBr and CsI. The second was a mixture of PbI$_2$ and PbBr$_2$. The crucibles were loaded into the evaporation chamber which was then pumped down to 6×10$^{-6}$ mTorr. Then, the boat containing the mixture of CsI/Br was heated slowly until reaching a steady evaporation rate, 1.0 Å/s. After reaching desired evaporation rate, the shutter was manually opened and sequentially closed after the desired thickness was deposited. Then, the power source heating the crucible was shut off, so that the evaporation rate lowered to zero. The above steps were repeated to evaporate Pb(I/Br)$_2$. These steps were repeated three times, to create three alternating layers of 16 nm of CsBr and 10 nm PbI$_2$ was evaporated onto three separate clean glass substrates, to create three samples labeled 1B, 2B, and 3B.

After evaporation, sample 1B was not thermally treated, sample 2B was first annealed at 100° C. for 3 hours and then at 150° C. for 2.5 hours, and sample 3B was annealed for 100° C. for 3 hours.

Figure 2:
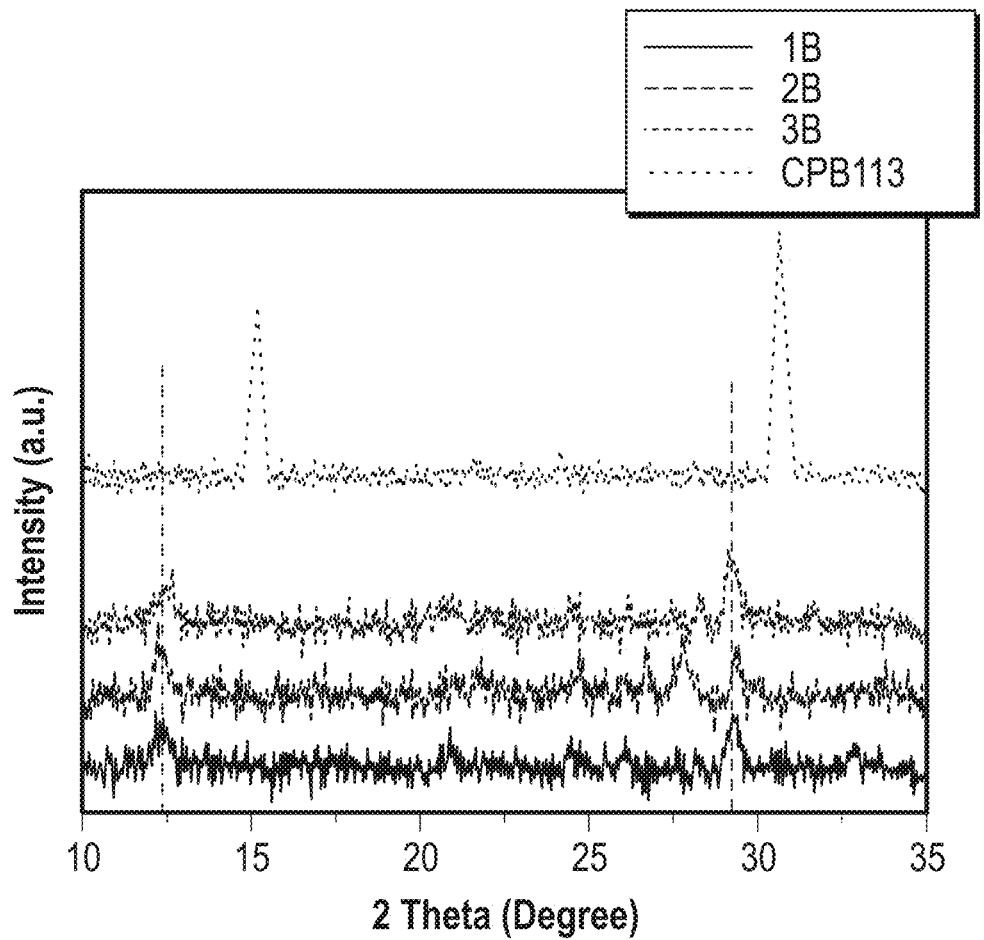
FIG. 2 is a graph which illustrates the XRD spectra for perovskite materials according to embodiments of the present disclosure.

The XRD spectra for samples 1B, 2B, and 3B, and a sample prepared from pure CsPbBr$_3$ using a standard solution-based process are shown in FIG. 2.

The measured diffraction peaks at 15° and 31° in the CsPbBr$_3$ sample correspond to orthorhombic CsPbBr$_3$ peaks, indicating that this solution-based CsPbBr$_3$ sample had an orthorhombic crystalline structure.

In contrast, samples 1B, 2B, and 3B showed a weak diffraction peak at 12.5° and about 29°, indicating that these samples have a cubic crystal structure. For example, cubic CsPbBr$_3$ has an additional peak around 25°.

Example 2: Tuning Bandgap

Bandgap tuning for a $CsPb(I_xBr_y)_3$ perovskite is accomplished by controlling the mass ratio between bromine and iodine ($I_x:Br_y$). The mass ratio between bromide and iodine is controlled by the mass ratio between the precursors CsI:CsBr or PbI$_2$:PbBr$_2$. Two sets of samples of varying mass ratio between bromide and iodine ($I_y:Br_x$): I2:Br1, I1:Br1, I1:Br2, I0:Br3, and I3:Br0 were evaporated onto glass substrates according to the dual-source evaporation method described in Example 1 The ratio of iodine to bromine in each of these samples is shown below in Table 1. Post evaporation, the first set of samples was thermally annealed on a hot plate at 100° C., and the second set was annealed on hot plate at 150° C.

TABLE 1

| Iodine to Bromine Ratio in Experimental Samples | |
|---|---|
| Sample | Iodine:Bromine Ratio |
| I2Br1 | 2:1 |
| I1Br1 | 1:1 |
| I1Br2 | 1:2 |
| I0Br3 | 0:3 |
| I3Br0 | 3:0 |

Figure 3A:
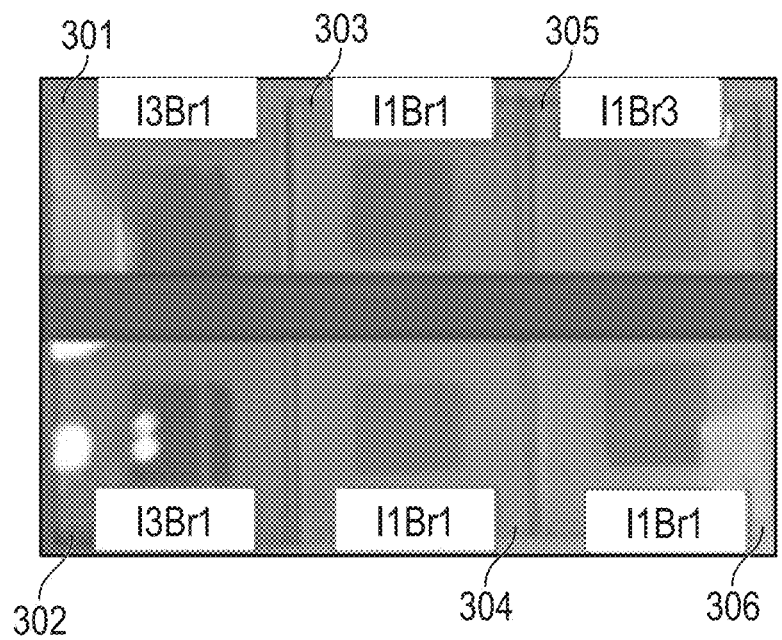
FIG. 3A is a series of photographs of samples of perovskite materials under ambient light.
Figure 3B:
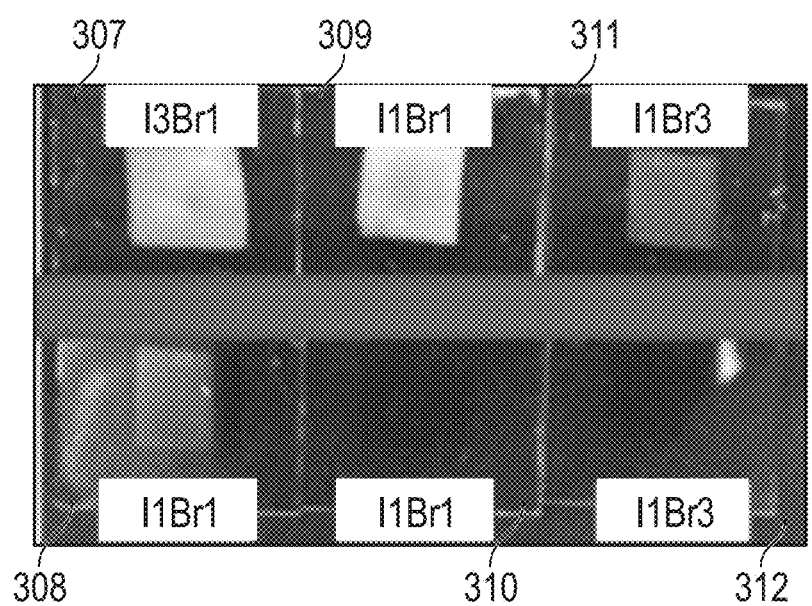
FIG. 3B is a series of photographs of samples of perovskite materials under ultraviolet light.

Images of samples under ambient light are shown in FIG. 3A and images of samples under ultraviolet light are shown in FIG. 3B. Photos 301, 303, 305, 307, 309, and 311 show the samples which were annealed at 100° C., and photos 302, 304, 306, 308, 310, and 312 show the samples which were annealed at 150° C. As can be seen from these figures, these samples each exhibit different colors under ambient and ultraviolet light. For example, among the samples which were annealed at 100° C., sample I3Br1, shown in photo 307, is orange under UV light, sample I1Br1, shown in photo 309, is a yellow green under UV light, and sample I1Br3, shown in photo 311, is a dark green under UV light. In other words, the varying ratios of iodine to bromine are able to successfully tune the bandgap to achieve different colors when exposed to ambient and ultraviolet light.

Figure 4:
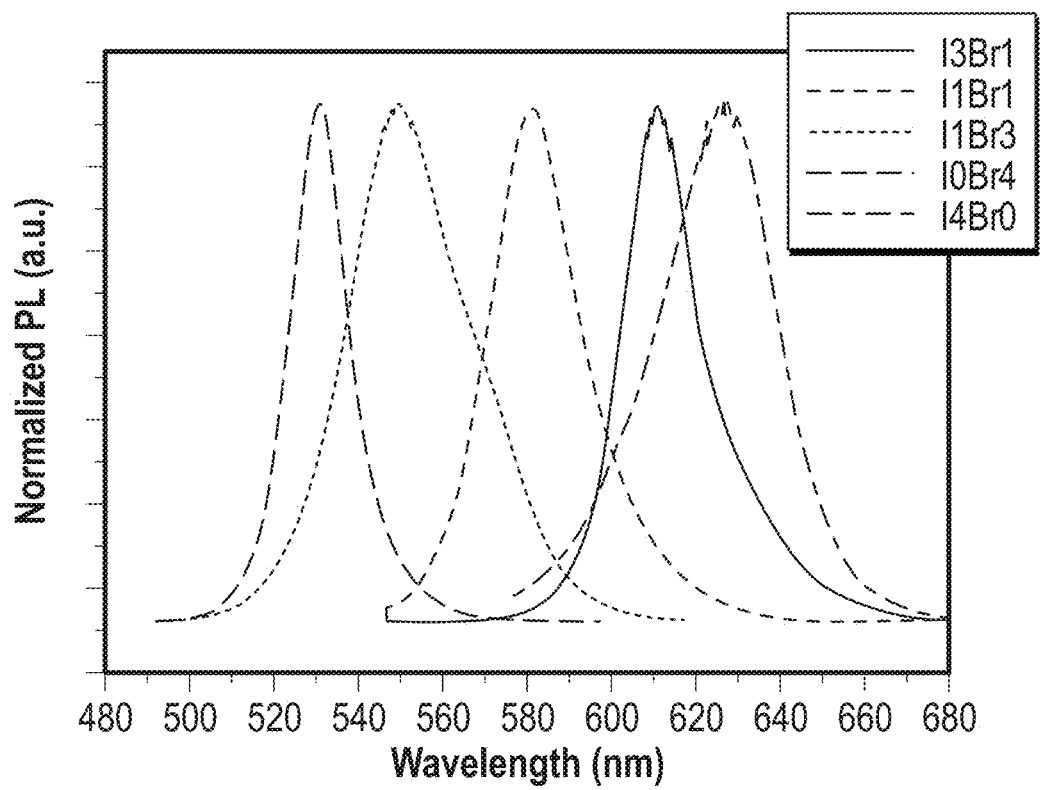
FIG. 4 is a graph which illustrates photoluminescence (PL) spectra of perovskite materials according to embodiments of the present disclosure.
Figure 5:
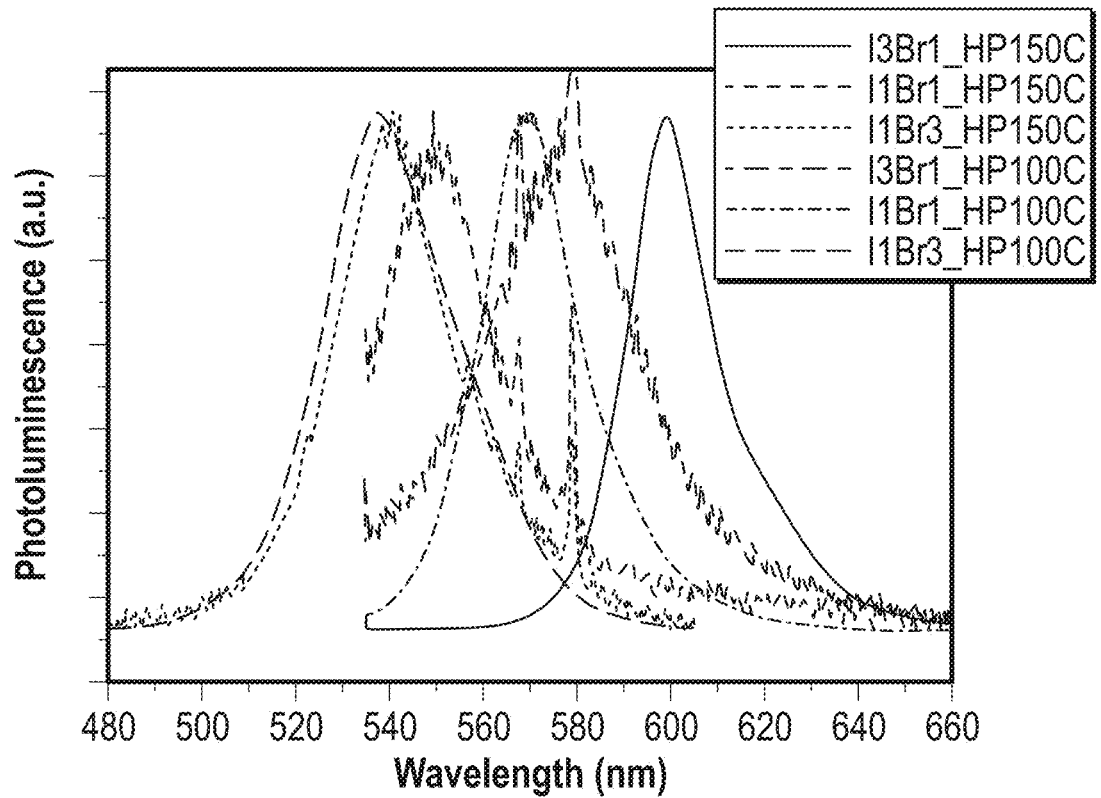
FIG. 5 is a graph which illustrates PL spectra of perovskite materials according to embodiments of the present disclosure.

These visual determinations are confirmed by the photoluminescence (PL) spectra shown in FIGS. 4-5. These figures show that both sets of samples have unique PL peak positions, indicating that each of the samples exhibits a different color. As is further confirmed by these figures, samples with higher concentration of bromide emit at lower wavelengths. FIG. 4 also shows the normalized PL for control experiments I0Br4 and I4Br0, which each only contained bromine or iodine, respectively.

Figure 6:
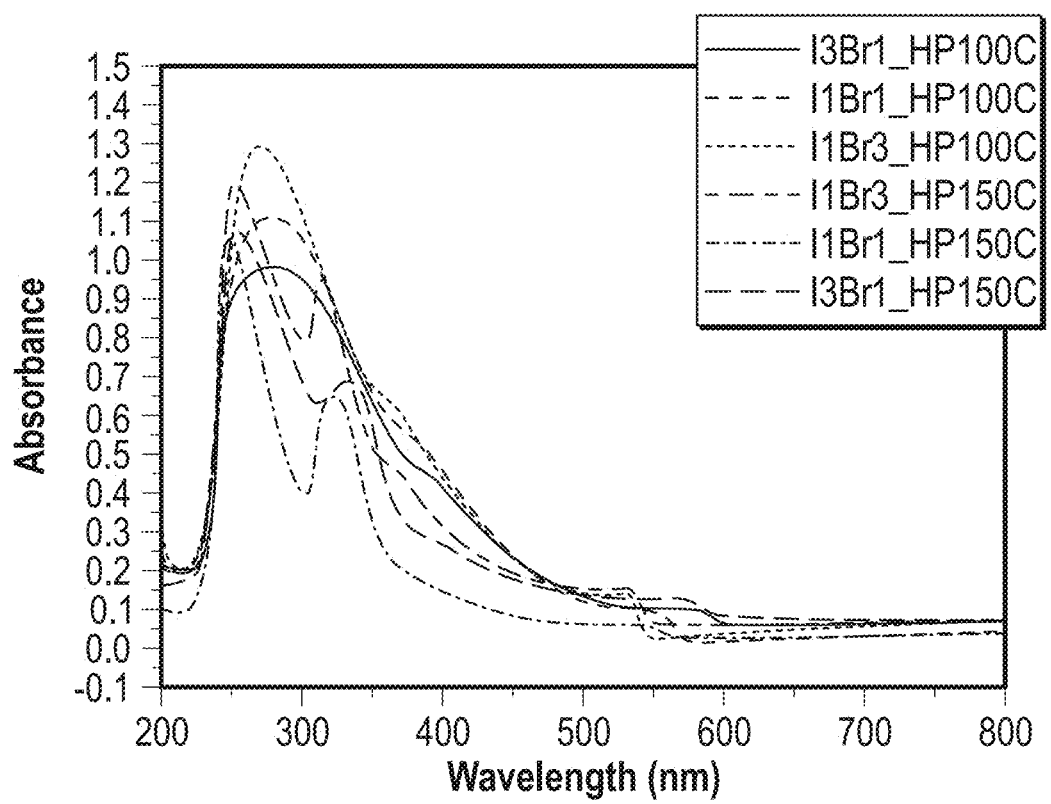
FIG. 6 is a graph which illustrates UV-vis absorption spectra of perovskite materials according to embodiments of the present disclosure.

Next, UV-vis absorption spectra were prepared for each of the samples, as shown in FIG. 6. These UV-vis absorption spectra show that samples annealed at 150° C. have additional absorption peaks outside of visible light range. These peaks, such as the absorption onset at around 320 nm indicate that these samples contain the insulating non-perovskite $Cs_4Pb(I_xBr_y)_6$ phase. Further inspection of absorption spectra reveals peaks at higher wavelengths corresponding to the photo-active $CsPb(I_xBr_y)_3$ phase for both sets of samples. Samples annealed at 100° C. do not show peaks corresponding to $CsPb(I_xBr_y)_3$ phase.

Example 3: Compositional Tuning

While annealing at higher temperatures can produce both an insulating non-perovskite structural phase and a photo-active perovskite phase, dynamic control over the ratio between both the two phases would be particularly desirable.

To achieve stable PL peaks, control of the ratio between the $Cs_4Pb(I_xBr_y)_6$ phase and $CsPb(I_xBr_y)_3$ phase is critical. The ratio between the two structural phases are dictated by the molar ratio between cesium and lead. The number of moles is directly proportional to the amount or thickness of solid-state precursor solutions evaporated. For instance, an 8 nm thick evaporated film of CsBr contains more moles of cesium than 3 nm thick film. Therefore, the ratio between the two phases is controlled by the evaporation thickness ratio between the precursor solutions.

Four alternating layers of various thicknesses of Cs(I/Br) and $Pb(I/Br)_2$ solution were evaporated onto clean glass substrates using the methods described above, to prepare four separate samples labeled 3_32, 3_22, 3_23, and 3_24. The thickness ratios ($CsI/Br:Pb(I/Br)_2$) of these samples are shown below in Table 2.

TABLE 2

Thickness Ratios of CsI/Br to $Pb(I/Br)_2$ in Experimental Samples

| Sample | $CsI/Br:Pb(I/Br)_2$ |
|---|---|
| 3_32 (or 32) | 3:2 |
| 3_22 (or 22) | 2:2 |
| 3_23 (or 23) | 2:3 |
| 3_24 (or 24) | 2:4 |

The mass ratio between bromide and iodide for each sample was fixed at one to one. After evaporation, the samples were transferred into a glove box and annealed on a hotplate at 150° C. for thirty minutes. After annealing, a thin layer of 0.5 wt % PMMA dissolved in toluene was spin-coated at 4,000 rpm for forty seconds on top of the perovskite.

Figure 7:
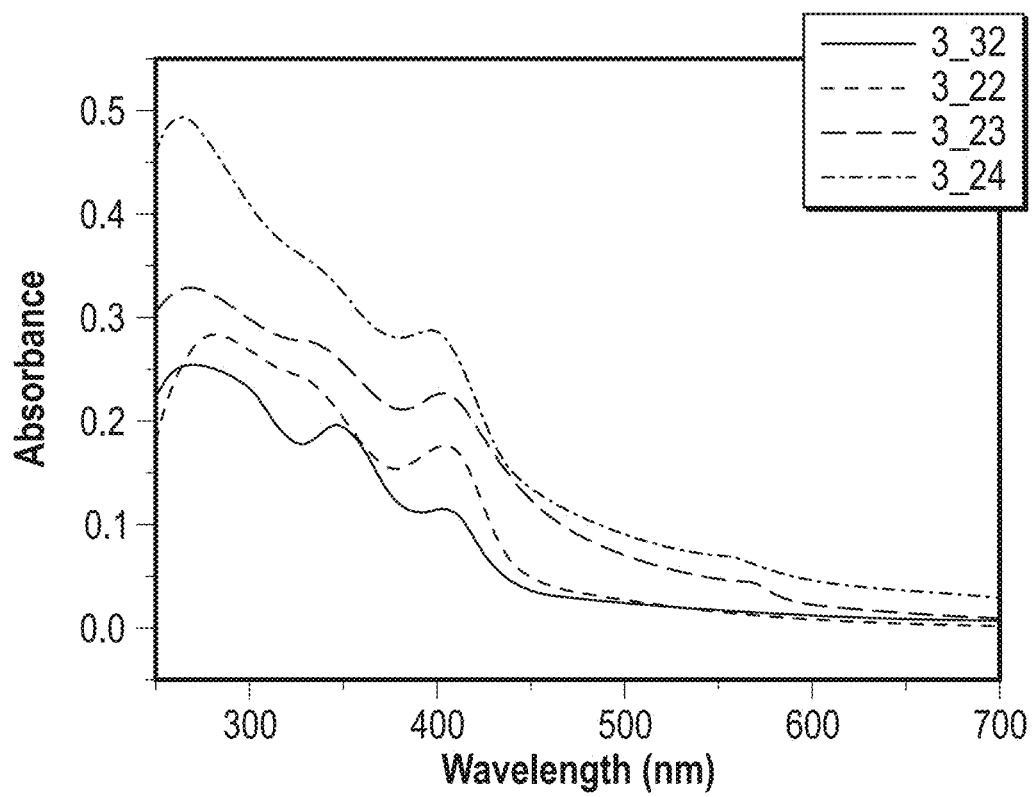
FIG. 7 is a graph which illustrates UV-vis absorption spectra of perovskite materials according to embodiments of the present disclosure.
Figure 8:
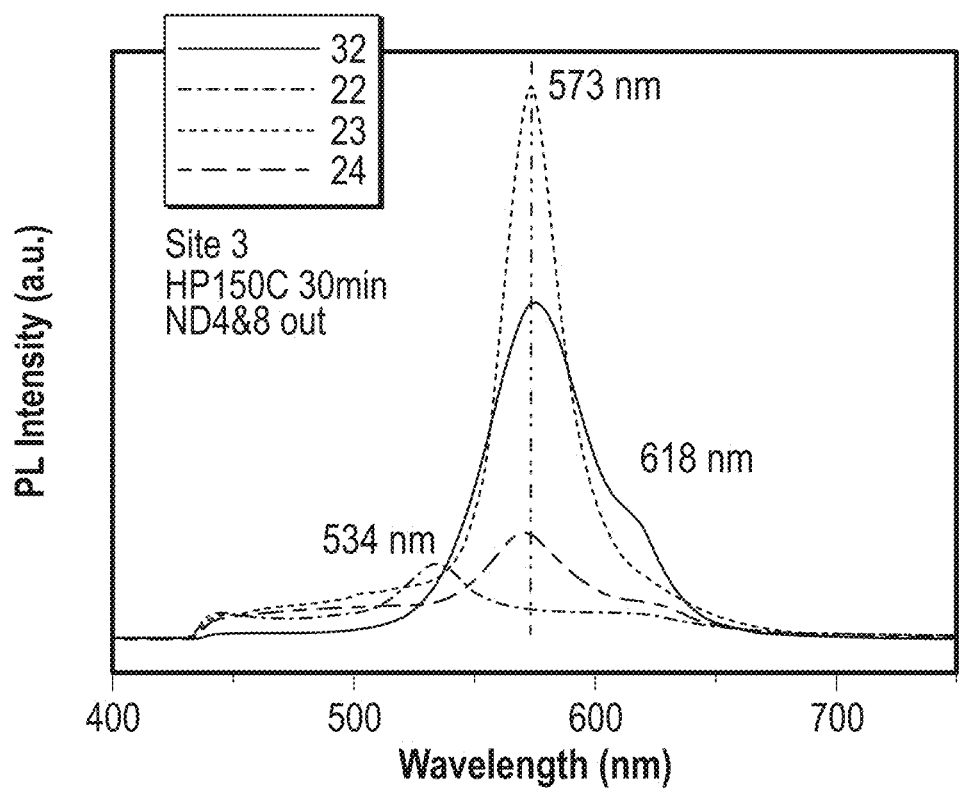
FIG. 8 is a graph which illustrates PL spectra of perovskite materials according to embodiments of the present disclosure.

Then, the UV-vis absorption of each sample was measured. UV-vis absorption spectra for each thickness ratio is shown in FIG. 7. As can be seen in this figure, each sample has an absorption peak around 415 nm, signifying that the various thickness ratios between cesium and lead do not affect the PL wavelength. All samples show multiple absorption peaks both inside and outside the visible light range. This is reflected in the PL spectra where all except for the sample with thickness ratio of 2:2 nm have a strong emission peak around 570 nm, as shown in FIG. 8.

Figure 9:
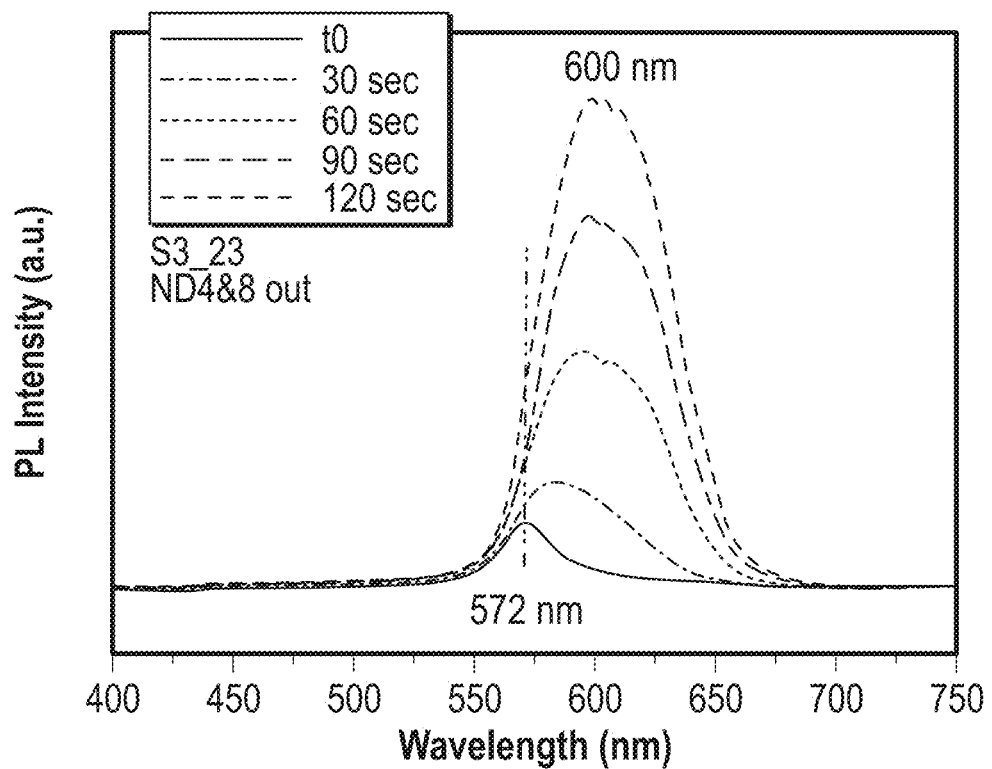
FIG. 9 is a graph which illustrates PL spectra of perovskite materials according to embodiments of the present disclosure.
Figure 10:
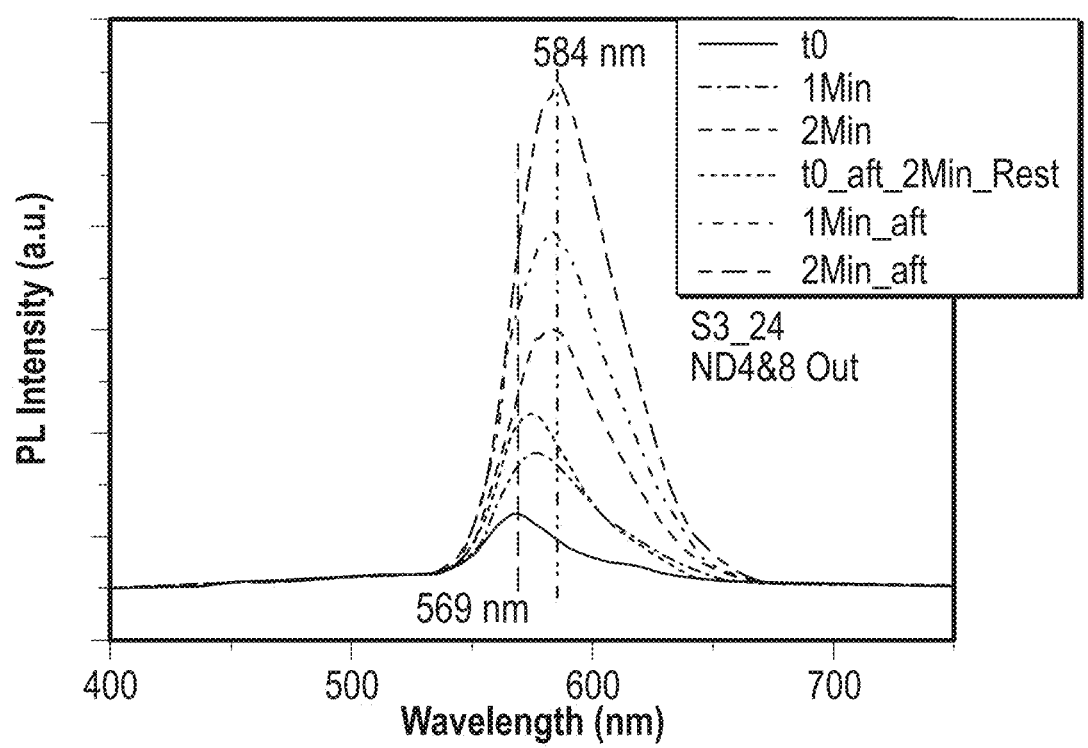
FIG. 10 is a graph which illustrates PL spectra of perovskite materials according to embodiments of the present disclosure.

Next, the PL spectra for samples S3_23 and S3_24, which both had an initial PL wavelength around 570 nm, were examined over time, as shown in FIGS. 9 and 10, respectively.

In FIG. 9, the PL spectra is shown for sample S3_23 initially, and then in 30-second increments over a period of two minutes of illumination. This figure indicates that phase segregation occurred over time, resulting in the formation of iodide-rich and bromide-rich domains indicated by the 30 nm red shift in PL peak position during the 120 second excitation.

In FIG. 10, the PL spectra is shown for sample S3_23 initially, and then in 30-second increments over a period of two minutes of illumination. This figure indicates that phase segregation occurred over time, resulting in the formation of iodide-rich and bromide-rich domains indicated by the 15 nm red shift in PL peak position during the 120 second excitation.

As can be seen from FIGS. 9 and 10, the PL peak positions for samples with thickness ratio of 2:4 nm and 2:3 nm demonstrate behaviors such as red-shifting, significant growth in intensity, and PL peak recoverability in dark, all of which are indicative of phase segregation. Though phase segregation occurred for both these samples, the final peak position for each differed. Samples with a thickness ratio of 2:4 nm red-shift by about fifteen nanometers, moderately better than the other sample (2:3 nm) which red-shifted by thirty nanometers. These results suggest that perovskites of the formula $Cs_4PbX_6$ may play a role in suppressing phase segregation.

Example 4: Improved Stability Perovskites

As described in Example 2 above, the bandgap size of halide perovskite materials can be tuned by mixing different halogen ions. However, as described in Example 3 above, it has been observed that these mixed halide perovskites suffered from severe phase segregation under optical illumination. It was surprisingly discovered that by embedding nanocrystals of the mixed halide perovskites in an endotaxial matrix, the tuned bandgap remained remarkably stable, even under optical illumination 4400 times of solar radiation. Without intending to be bound by any particular theory, it is believed that agreement between the experimental and a thermodynamic nucleation model suggests that the size of the nanocrystals and the host-guest interface are critical for the photo-stability achieved.

Thin films of mixed-halide perovskites were prepared using dual-source vapor deposition, as described above. Specifically, solid precursors $PbBr_2/PbI_2$ and CsBr/CsI were evaporated onto glass substrates using an Edwards E306A coating system for dual-source evaporation, followed by thermal annealing for sufficient inter-diffusion and reactions. The glass substrates were cleaned sequentially by sonication in 1% Alconox precision cleaner solution, acetone, and isopropyl alcohol for 20 minutes followed by UV ozone treatment for 10 minutes prior to use. With a base pressure of $6 \times 10^{-6}$ mbar, the two precursor mixtures containing Cs and Pb salts were evaporated alternatingly from separate quartz crucibles. The evaporation rates were controlled 0.1-0.5 Å/s for the Pb salts and 0.1-0.5 Å/s for Cs salts. The above steps were repeated until the desired compositions and film thicknesses were obtained. The evaporated samples were annealed at 150° C. on a hot plate in a nitrogen glove box for 30 minutes. With a stoichiometric ratio of Pb to Cs in the premixed precursors, polycrystalline thin films of $CsPb(Br_xI_{1-x})_3$ were obtained, by varying the stoichiometric ratio of CsBr to CsI and $PbBr_2$ to $PbI_2$. Halide perovskites of the formula $CsPb(Br_xI_{1-x})_3$ were prepared, wherein x has the values set forth in Table 3 below.

TABLE 3

Formulas of CsPb($Br_xI_{1-x}$)$_3$ Halide Perovskites

| Sample No. | Value of x |
|---|---|
| 1 | 0.8 |
| 2 | 0.7 |
| 3 | 0.6 |
| 4 | 0.5 |
| 5 | 0.4 |

Next, these samples were characterized using high-resolution transmission electron microscopy (HR-TEM) images acquired using a JEM-ARM200cF operated at 200 kV. Samples for the TEM measurements were prepared by evaporating the thin films directly onto Cu/lacey-carbon TEM grids. These samples were further characterized using PANalytical X'PERT Pro powder X-ray diffractometer with a Cu Kα source to examine the crystal phases of the thin films after thermal annealing. The diffraction patterns were recorded from 2θ=10° to 45° with a step size of 0.0167° at 0.80/min. Optical absorption was measured using an Agilent Cary 5000 UV-Vis-NIR spectrometer. To avoid exposure to the humidity in air, the samples were placed in an airtight container with two sapphire windows. Photoluminescence spectra were measured using a HORIBA iHR320 spectrometer, equipped with a HORIBA Synapse back-illuminated CCD. The samples were placed in a vacuum chamber with cryogenic temperature control (Janis ST-500). A continuous-wave diode laser (405-nm) was used as the photoexcitation source. By focusing the laser beam to a 3-μm spot, the optical power density (i.e. intensity) could reach as high as 442.0 W/cm².

Figure 11A:
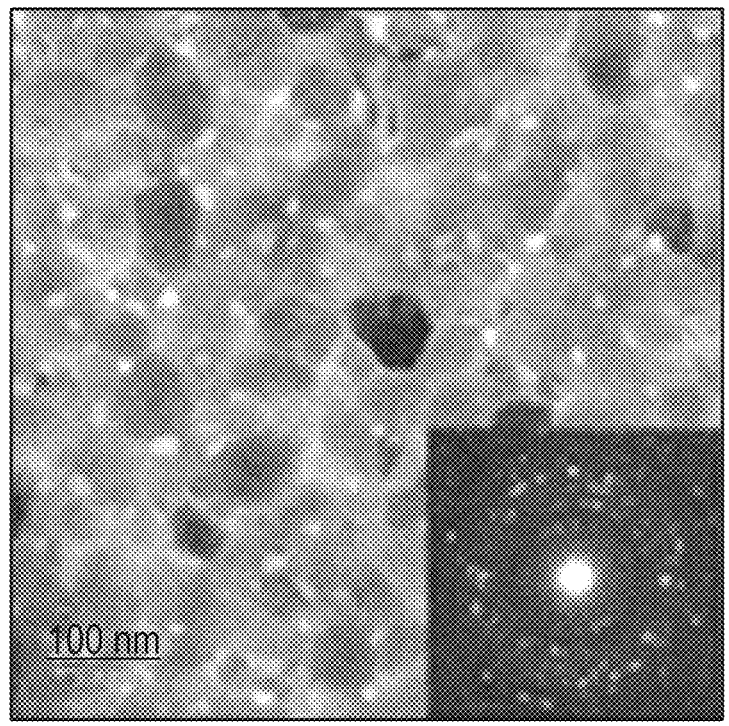
FIG. 11A is a high-resolution transmission electron microscopy (TEM) image of a perovskite material according to an embodiment of the present disclosure.
Figure 11B:
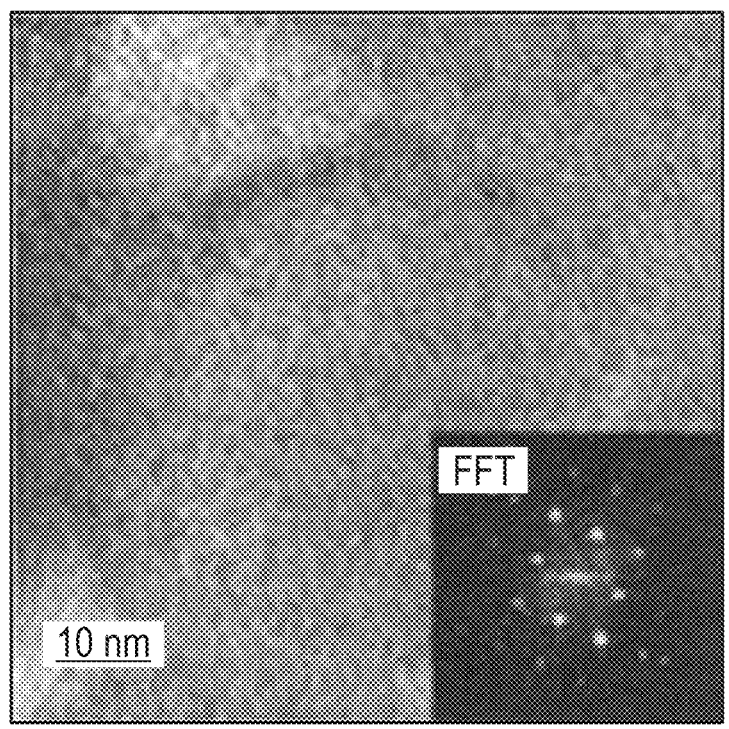
FIG. 11B is a high-resolution TEM image of a perovskite material according to an embodiment of the present disclosure.
Figure 11C:
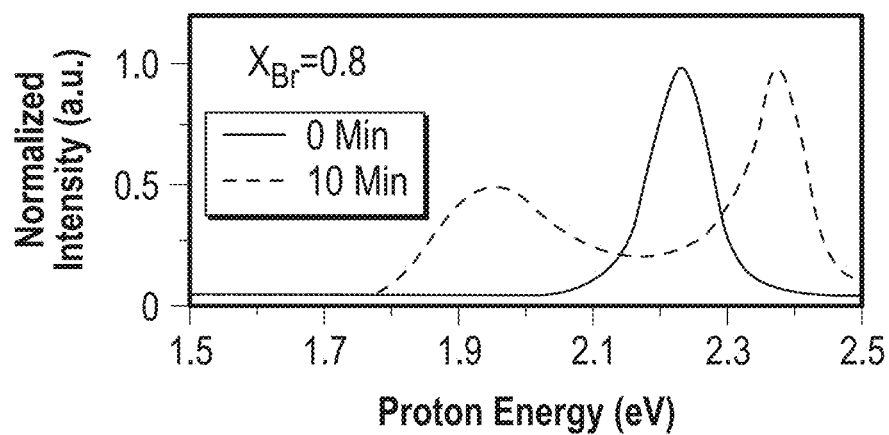
FIGS. 11C-11G illustrate PL spectra of perovskite materials according to embodiments of the present disclosure.
Figure 11D:
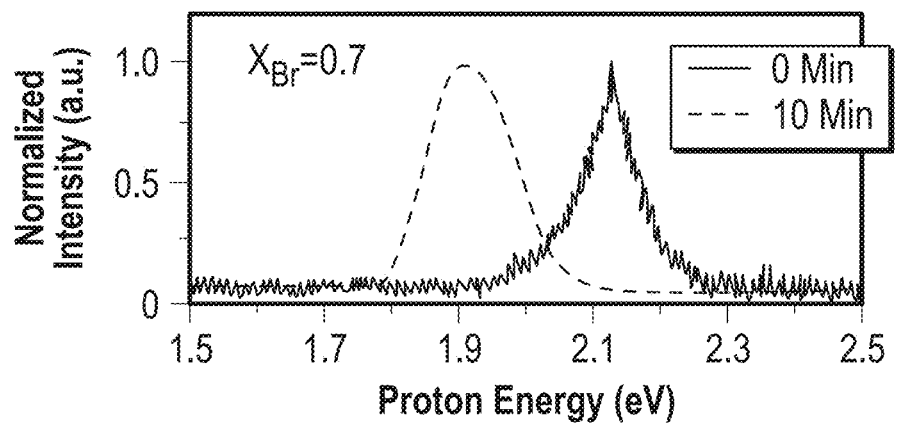
Figure 11E:
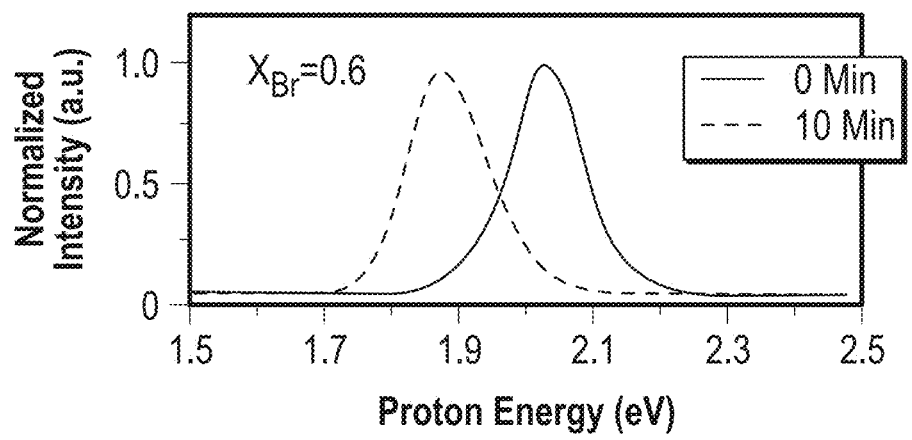
Figure 11F:
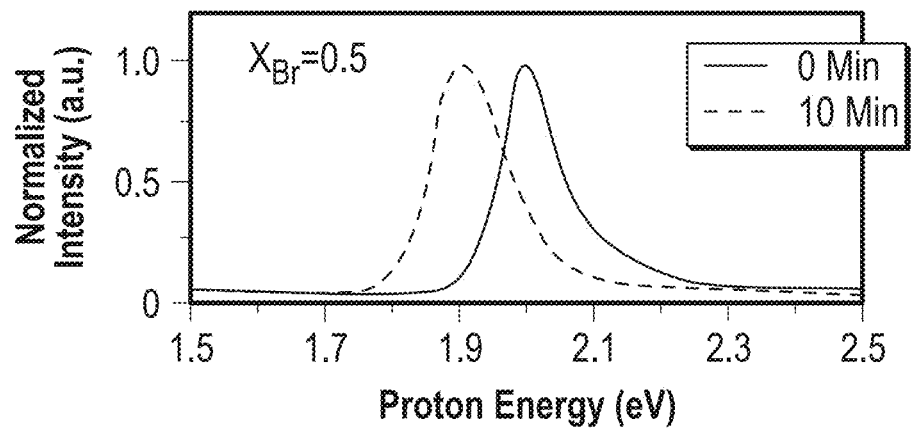
Figure 11G:
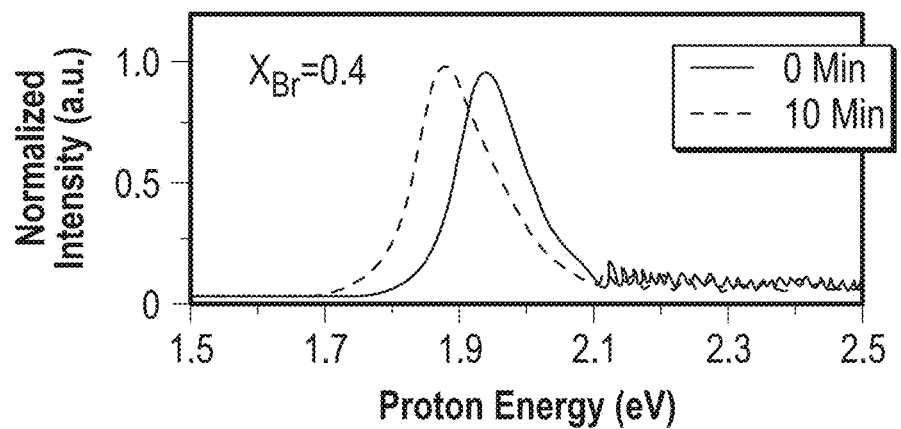

FIG. 11A is a representative high-resolution TEM (HR-TEM) image of the polycrystalline CsPb($Br_xI_{1-x}$)$_3$ thin films produced according to this method, which was acquired using a JEM-ARM200cF operated at 200 kV. Samples for the TEM measurements were prepared by evaporating the thin films directly onto Cu/lacey-carbon TEM grids. Specifically, FIG. 11A is an HR-TEM image of a thin film with the composition of Sample No. 3 with an inset fast fourier transformed (FFT) pattern, showing an average domain size around 35 nm. FIG. 11B is an HR-TEM image of a single domain of the halide perovskite of FIG. 11A and the inset FFT pattern. The selected area diffraction (SAD) patterns of the inset FFT confirmed that these thin films were composed of pure cubic-phase perovskites.

FIGS. 11C-11G illustrate the photoluminescence of sample numbers 1-5, respectively. Specifically, FIGS. 11C-11G show the freshly made samples (shown in solid lines) and samples after being illuminated for 10 minutes with three times the AM1.5 solar irradiation (shown in dotted lines). As can be seen from FIGS. 11C-11G, the photoluminescence peak (corresponding to the bandgap size) of CsPb($Br_xI_{1-x}$)$_3$ could be tuned by varying the ratio of Br to I in the premixed precursors. However, the photoluminescence peak of these pure mixed-halide perovskites appeared unstable under extended photoexcitation. The peak position, regardless of its initial wavelength, redshifted to 1.87 eV within 10 min of illumination at an intensity equivalent to three times the AM1.5 solar irradiation. This redshift, corresponding to a reduction in the bandgap size, was consistent with previously reported observations, and suggests that the initially homogeneous CsPb($Br_xI_{1-x}$)$_3$ segregated into Br-rich and I-rich domains with increased and decreased bandgap sizes, respectively. The energy transfer between neighboring domains made the small-bandgap species (i.e. the I-rich domains) dominate the photoluminescence after the phase separation. The only exception in our experiments was the sample with very large Br content (FIG. 11C), which exhibited photoluminescence from both large- and small-bandgap species (2.4 eV and 1.87 eV). Without intending to be bound by any particular theory, it is believed that the amount of the Br-rich domains in this case was likely too large to be quenched completely by the I-rich domains.

Next, mixed-halide perovskites were created in form of nanocrystals and were embedded in a non-perovskite matrix. As described in Examples 2 and 3 above, the bandgap of mixed halide perovskites according to the present disclosure can be tuned by varying the ratio between the iodine-containing and bromine-containing precursors being evaporated to produce the mixed halide perovskite. However, it was further surprisingly discovered that, by adjusting the ratio between the Cs-containing and Pb-containing precursors, the relative amounts of the CsPb($Br_xI_{1-x}$)$_3$ perovskite and the Cs$_4$Pb($Br_xI_{1-x}$)$_6$ non-perovskite film in the resulting film could be adjusted. These host-guest structures of this example were created by simply increasing the relative weight ratio of the Cs-containing precursor (i.e. CsBr/CsI) relative to the Pb-containing precursor (i.e. PbBr$_2$/PbI$_2$) to produce a mixture of CsPb($Br_xI_{1-x}$)$_3$ nanocrystals and Cs$_4$Pb($Br_xI_{1-x}$)$_6$ non-perovskite matrix. Mixed halide perovskites of the formula CsPb($Br_xI_{1-x}$)$_3$ in a non-perovskite matrix of the formula Cs$_4$Pb($Br_xI_{1-x}$)$_6$ were prepared, where x has the values detailed in Table 4 below.

TABLE 4

Formulas of CsPb($Br_xI_{1-x}$)$_3$ and Cs$_4$Pb($Br_xI_{1-x}$)$_6$ Mixed Halide Perovskites

| Sample No. | Value of x |
|---|---|
| 6 | 0.8 |
| 7 | 0.7 |
| 8 | 0.6 |
| 9 | 0.5 |
| 10 | 0.4 |

Figure 11H:
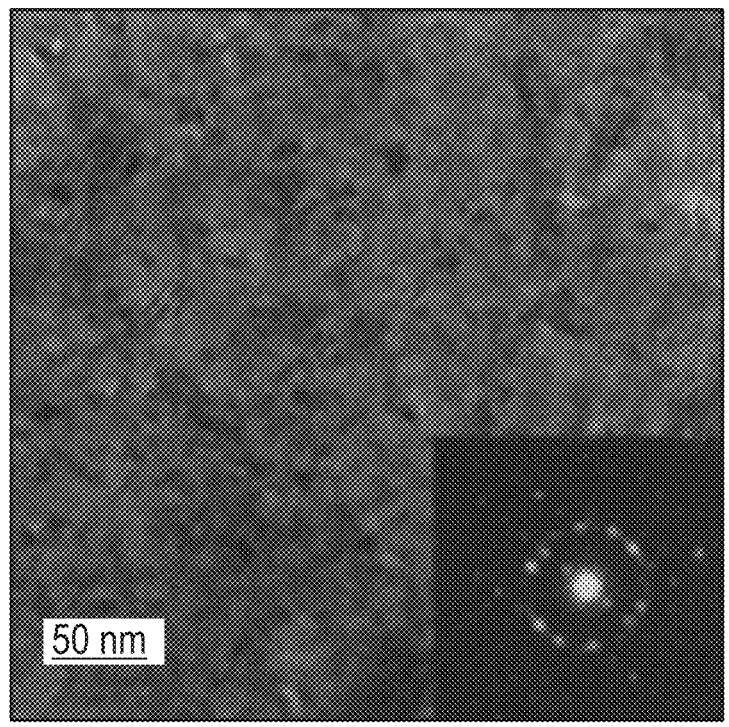
FIG. 11H is a high-resolution TEM image of a perovskite material according to an embodiment of the present disclosure.
Figure 11I:
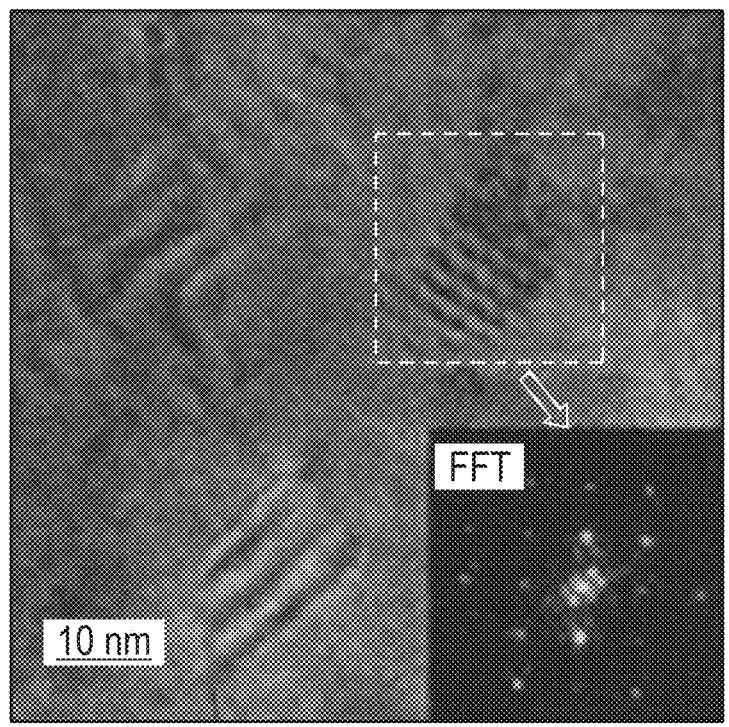
FIG. 11I is a high-resolution TEM image of a photoluminescent perovskite material according to an embodiment of the present disclosure.
Figure 11J:
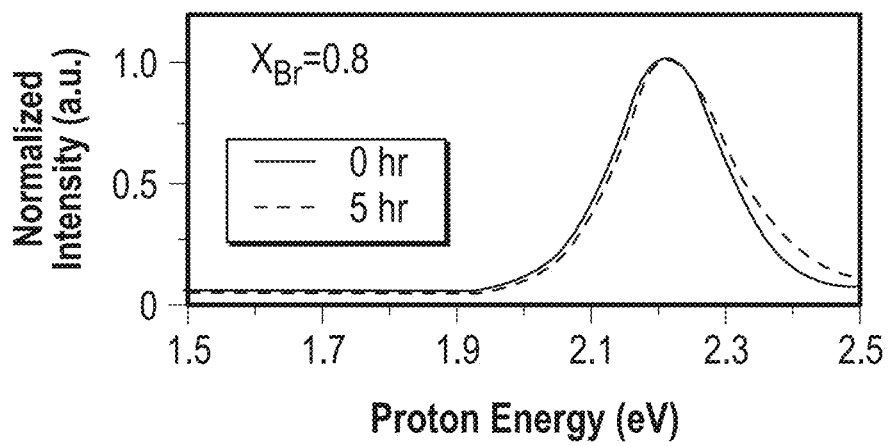
FIG. 11J-11N illustrates PL spectra of photoluminescent perovskite materials according to embodiments of the present disclosure.
Figure 11K:
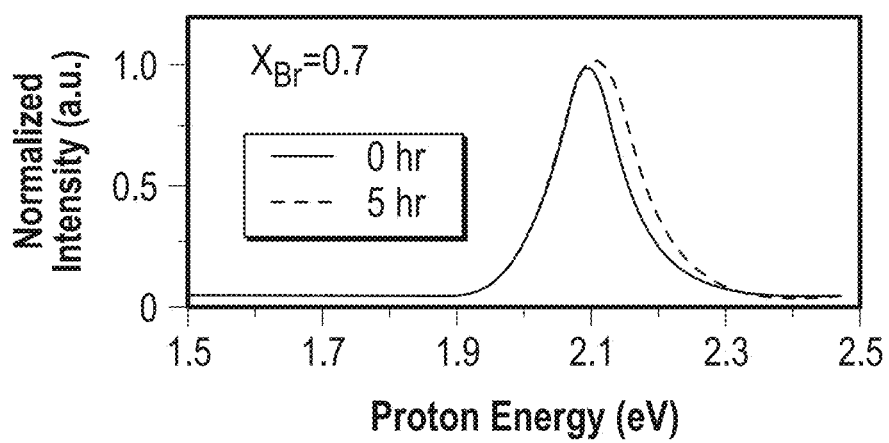
Figure 11L:
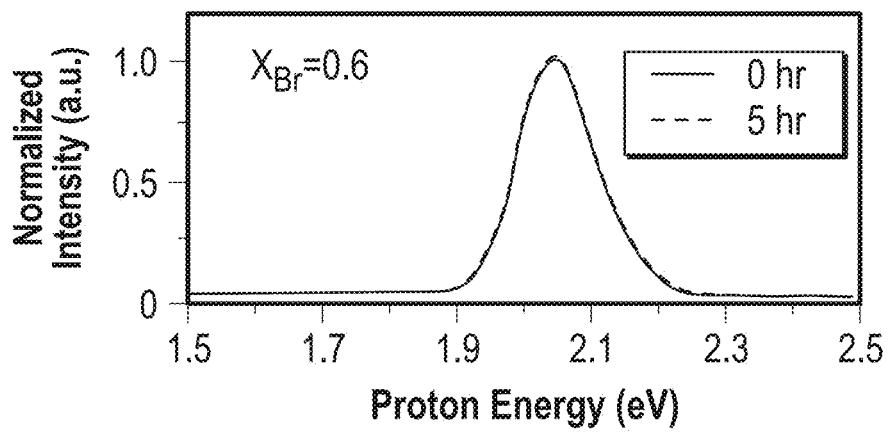
Figure 11M:
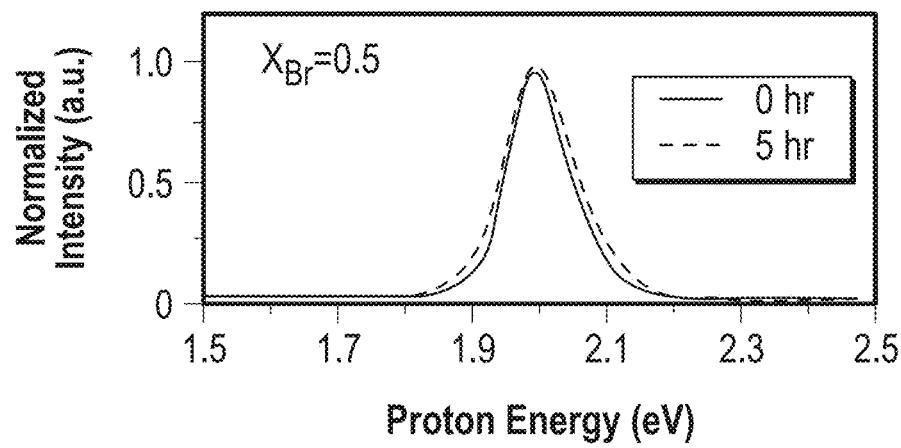
Figure 11N:
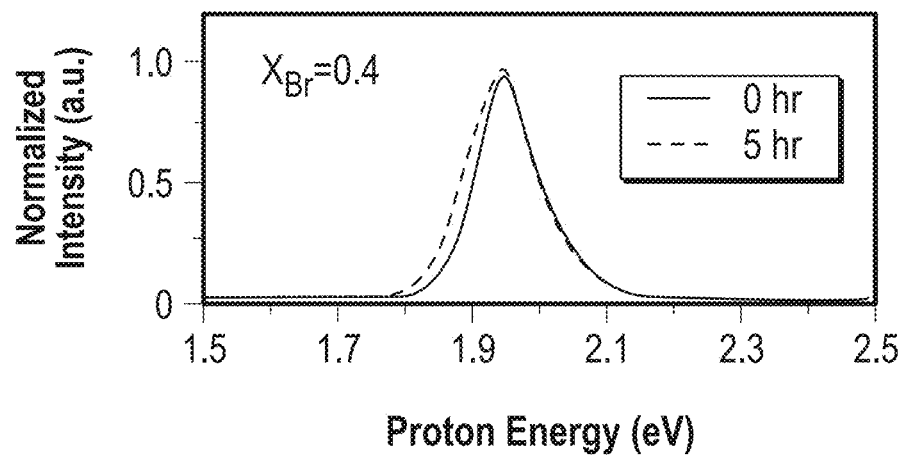

FIG. 11H is an HR-TEM image of a CsPb($Br_xI_{1-x}$)$_3$ and Cs$_4$Pb($Br_xI_{1-x}$)$_6$ composite thin film with an inset FFT pattern. As can be seen from these images, the CsPb($Br_xI_{1-x}$)$_3$ and Cs$_4$Pb($Br_xI_{1-x}$)$_6$ perovskite formed host-guest structures. Furthermore, the electron diffraction pattern was dominated by a Cs$_4$Pb($Br_xI_{1-x}$)$_6$ single crystal, where the ring came from the distributed CsPb($Br_xI_{1-x}$)$_3$ crystallites. FIG. 11I is an HR-TEM image and FFT inset of the perovskite film of FIG. 11H. FIG. 11I shows clear Moiré Fringes, and indicates that the average CsPb($Br_xI_{1-x}$)$_3$ domain size was below 20 nm. The FFT pattern of the highlighted area confirmed that the Moiré Fringes were formed by overlapping the lattices of the Cs$_4$Pb($Br_xI_{1-x}$)$_6$ host and the CsPb($Br_xI_{1-x}$)$_3$ guest. FIGS. 11J-11N illustrate the photoluminescence of sample numbers 6-10, respectively. Specifically, FIGS. 11J-11N show the freshly made samples (shown in solid lines) and samples after being illuminated for 5 hours (3-sun intensity, 365-nm wavelength) (shown in dotted lines). As can be seen from FIGS. 11J-11N, after continuous illumination, the emission wavelength surprisingly remained unchanged in all the samples regardless of the Br/I mixing ratio crystallites in the composites exhibited high stability under 3-sun illumination.

Figure 12:
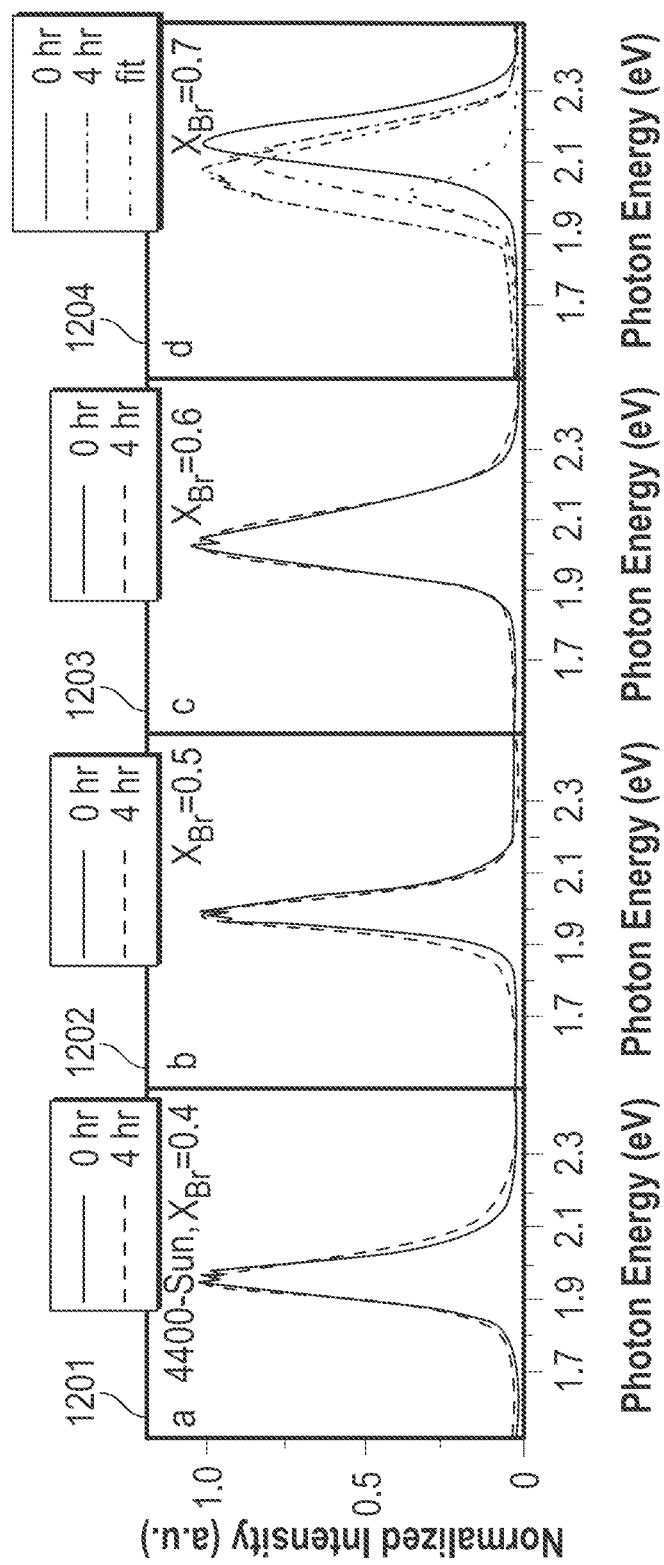
FIG. 12 illustrates PL spectra of photoluminescent perovskite materials according to embodiments of the present disclosure.

Samples 7-10 were next exposed to more intensive illumination, specifically 4 hours of illumination with 4400-sun intensity, using a focused laser beam (λ=405 nm). The photoluminescence of samples 7-10 before (solid lines) and after (dotted lines) this illumination is shown in FIG. 12 in graphs 1204, 1203, 1202, and 1201, respectively.

Remarkably, the tuned bandgap of the CsPb(Br$_x$I$_{1-x}$)$_3$/Cs$_4$Pb(Br$_x$I$_{1-x}$)$_6$ composites remained stable even under this extremely intensive illumination. No obvious changes were observed in the photoluminescence spectra taken from samples 8-10. However, with a higher bromine concentration, the photoluminescence peak of Sample 7 redshifted after 4 hours of illumination. The correlation between the photostability and the composition was consistent with the relative phase stability between the Br-rich and I-rich perovskites discussed above. However, the amount of peak shift appeared noticeably different between the composites and the pure perovskites discussed above. As can be seen from FIGS. 12 and 11C, the peak in the photoluminescence of the sample exposed to this intensive illumination settled at higher energy (2.00 eV) compared with the lower illumination (FIG. 1a, 1.87 eV). Without intending to be bound by any particular theory, it is believed that this quantitative difference suggests a smaller degree of phase separation in the composites with a smaller change of iodine concentration in the segregated I-rich domains.

Without intending to be bound by any particular theory, it is believed that the observed high photostability indicated that the interfacial energy was a more dominating factor in stabilizing a homogenous phase. Thus, it is believed that as long as the grain size of the mixed halide perovskites is sufficiently small, the presumable increase of the interfacial energy associated with the phase separation would dominate over the increase of the photoinduced strain energy, leading to a highly stable homogenous phase even with a high illumination intensity.

Example 5: Thermodynamic Modeling and Temperature Dependence of Stability of Mixed Halide Perovskites A thermodynamic model based on nucleation theory was developed which appears to explain the dependence on the morphology of the mixed-halide perovskites which was observed in Examples 3 and 4 above. In this model, whether the mixed-halide perovskites would remain homogeneous or experience phase separation was determined by changes of the Gibbs free energy, ΔG. The homogenous phase would be stable when ΔG is negative. The results of this thermodynamic model closely followed the experimental results observed in Examples 3 and 4.

Figure 13A:
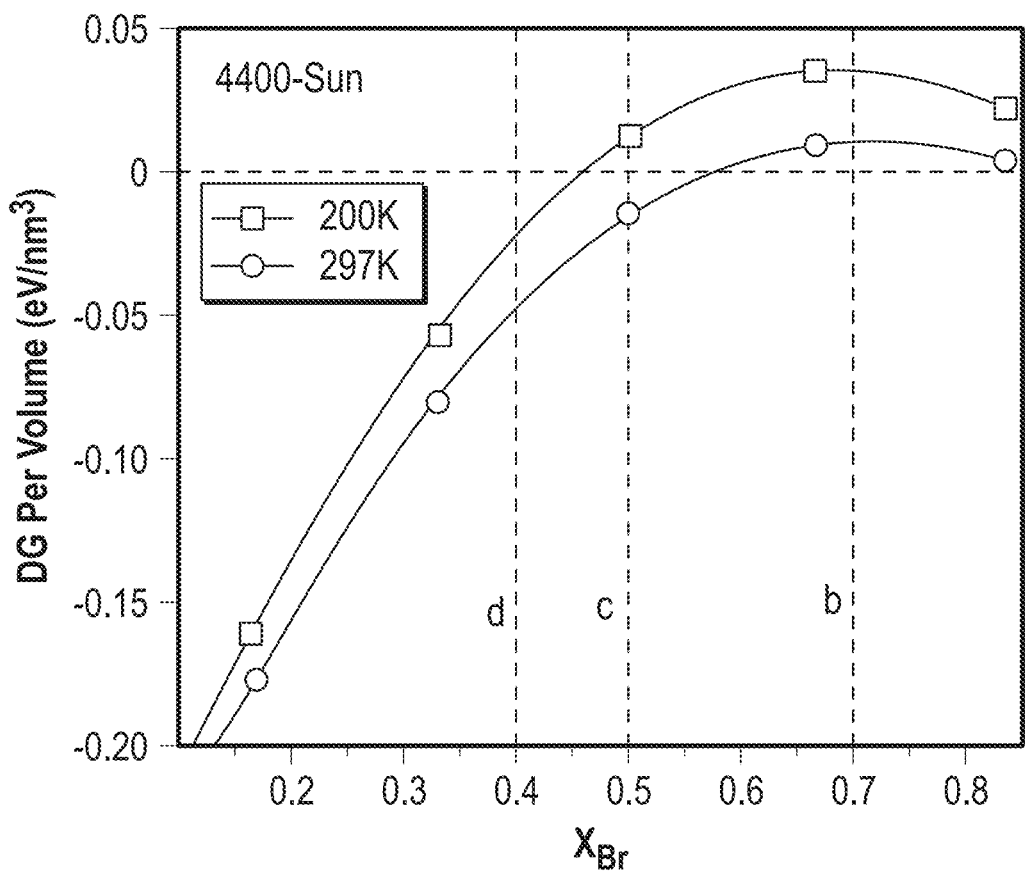
FIG. 13A illustrates the theoretical stability of halide perovskite materials according to embodiments of the present disclosure at various temperatures.

According to the theoretical model which was developed, it was believed that the stability of the mixed halide perovskites discussed in Examples 3 and 4 would further vary with temperature. Without intending to be bound by any particular theory, it was believed that an unstable mixed halide perovskite could experience further phase separation as the temperature is lowered, while samples which were photostable at room temperature could either become unstable or remain stable at lower temperatures, depending on their composition. FIG. 13A illustrates the Gibbs free energy ΔG per volume calculated for a mixed halide perovskite of the formula CsPb(Br$_x$I$_{1-x}$)$_3$ in a Cs$_4$Pb(Br$_x$I$_{1-x}$)$_6$ non-perovskite matrix at varying values of x. As can be seen from FIG. 13A, the stability of the halide perovskite (whether the ΔG is positive or negative) is dependent on temperature. For example, a mixed halide perovskite where x is 0.4 would be expected to be unstable at 297K, but stable at 200 K.

Figure 13B:
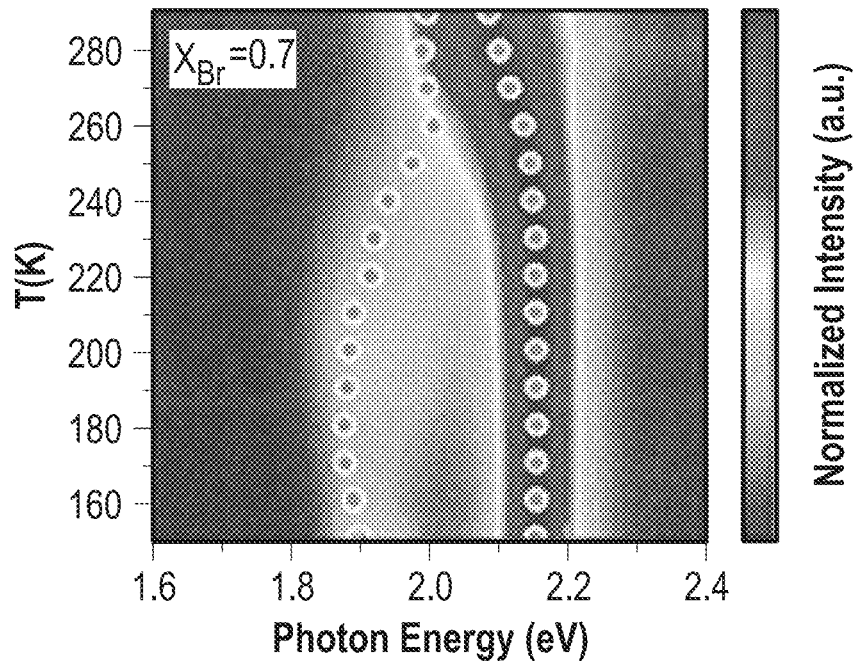
FIG. 13B illustrates the photoluminescence stability over varying temperatures for a perovskite material according to an embodiment of the present disclosure.
Figure 13C:
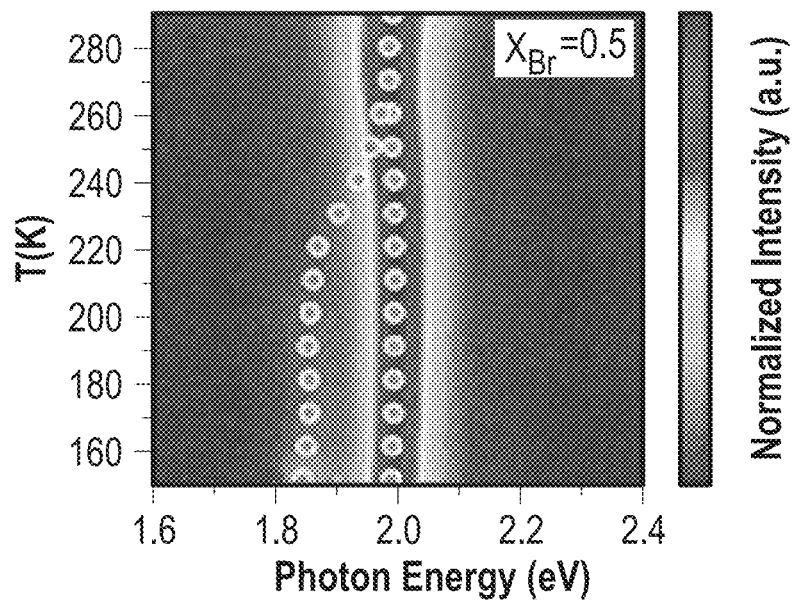
FIG. 13C illustrates the photoluminescence stability over varying temperatures for a perovskite material according to an embodiment of the present disclosure.
Figure 13D:
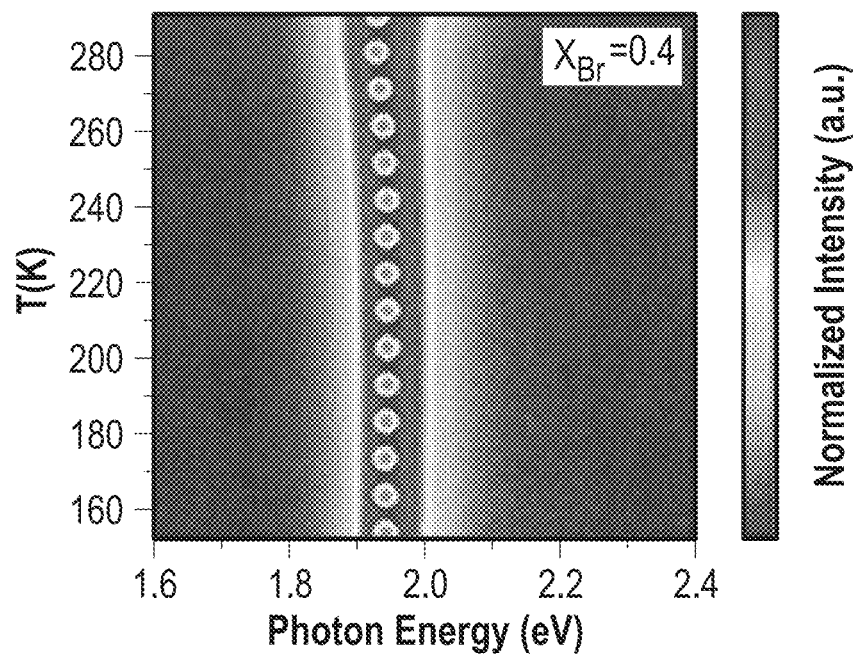
FIG. 13D illustrates the photoluminescence stability over varying temperatures for a perovskite material according to an embodiment of the present disclosure.

Next, the photoluminescence of Samples 7, 9, and 10 were measured at various temperatures to determine whether the temperature dependence shown by the theoretical model was present in practice. The results of these experiments are shown in FIGS. 13B-D, respectively. Photoluminescence spectra were measured at temperatures from 150 K to 290 K before and after exposure to 4400-sun illumination. Reduced photostability, indicated by further split of photoluminescence peaks, was observed at lower temperatures. The circles show the peak positions determined by fitting the measured photoluminescence spectra. As can be seen from FIG. 13B, the photoluminescence peak of this Br-rich perovskite split at room temperature after continuous optical illumination. The spectral separation between the photoluminescence peaks was found to increase continuously as the temperature was reduced from room temperature to 200 K. The larger spectral split indicated higher iodine and bromine concentrations in the segregated domains, respectively. As can be seen from FIG. 13C, a reduced photostability can also be observed in this perovskite with nearly 1:1 Br/I ratio. While no spectral shift was observed at room temperature, a new peak corresponding to I-rich domains emerged as the temperature was reduced. As can be seen from FIG. 13D, consistent with other measurements where I-rich perovskites appeared generally more photo-stable, the sample shown in this figure which had the higher iodine concentration (XBr=~0.4) remained consistently stable across the entire temperature range tested.

The agreement between the theoretically predicted and the experimentally measured temperature dependence further validated the model of phase separation based on nucleation. Without intending to be bound by any particular theory, it is believed that such phenomena could be attributed to the effect primarily driven by the changes of the entropy, which favored more uniformly distributed bromine and iodine anions (i.e. a homogenous phase) at elevated.

We claim:

1. A method of making a mixed halide perovskite composition comprising:
   depositing a first portion of a first precursor solution comprising Cs or Pb on a substrate; and
   depositing a first portion of a second precursor solution comprising Pb or Cs on the substrate, either sequential to or simultaneous with the deposition of the first portion of the first precursor solution,
   wherein (i) when the first portion of the first precursor solution comprises Cs, at least a portion of the second precursor solution comprises Pb, and (ii) when the first portion of the first precursor solution comprises Pb, at least a portion of the second precursor solution comprises Cs,
   wherein the depositing of the first and second precursor solutions is carried out in a manner effective to produce a mixed halide composition in the form of a perovskite embedded in a non-perovskite matrix,
   wherein the perovskite is in the form of nanocrystals having the formula: CsPb(A$_x$B$_y$)$_3$ and the non-perovskite matrix has the formula: Cs$_4$Pb(A$_x$B$_y$)$_6$,
   wherein A and B are each a halogen,
   wherein x and y are non-zero and x+y=1,
   wherein the mixed halide perovskite composition has a morphology which suppresses phase segregation of the mixed halide perovskite composition when subjected to optical or electrical stimuli to stabilize a tuned bandgap of the mixed halide perovskite composition.

2. The method of claim 1, wherein the step of depositing a first portion of the first precursor solution on the substrate and the step of depositing a first portion of the second precursor solution on the substrate are performed simultaneously.

3. The method of claim 1, wherein the step of depositing a first portion of the first precursor solution on the substrate and the step of depositing a first portion of the second precursor solution on the substrate are performed sequentially.

4. The method of claim 1, wherein the first precursor solution comprises CsBr or CsI and wherein the second precursor solution comprises $PbI_2$ or $PbBr_2$.

5. The method of claim 1, wherein the substrate comprises glass.

6. The method of claim 1, further comprising:
depositing a second portion of the first precursor solution on the substrate; and
depositing a second portion the second precursor solution on the substrate, either sequential to or simultaneous with the deposition of the second portion of the first precursor solution, wherein the second portions of the first and second precursor solutions are deposited on the first portions of the first and second precursor solutions.

7. The method of claim 1, wherein the depositing of the first and second precursor solutions is performed by a physical vapor deposition process.

8. The methods of claim 7, further comprising thermal annealing the first and second precursors following their deposition on the substrate.

9. The method of claim 1, wherein A and B are selected from iodine and bromine.

10. The method of claim 1, wherein x is ⅓ and y is ⅔, or x is ⅔ and y is ⅓.

11. The method of claim 1, wherein the mixed halide composition comprises a $Cs(I_x)_3$ layer and a $Pb(Br_y)_3$ layer.

12. The method of claim 1, wherein the mixed halide composition comprises a $Cs(Br_y)_3$ layer and a $Pb(I_x)_3$ layer.

13. The method of claim 1, wherein the mixed halide composition comprises a $CsPb(I_xBr_y)_3$ layer.

14. The method of claim 1, wherein the mixed halide composition has (i) a normalized photoluminescence of from about 500 nm to about 650 nm, or (ii) a UV-vis absorption peak between from about 225 nm to about 600 nm.

15. The method of claim 1, wherein:
the nanocrystals are in the form of photo-active crystallites of perovskite having the formula $CsPb(I_yBr_x)_3$, and
the non-perovskite matrix is in the form of photo-inactive insulating crystallites in which the photo-active crystallites are embedded.

16. The method of claim 15, wherein the mixed halide composition is the form of a film formed by a physical deposition process.

* * * * *